United States Patent [19]
Ogawa

[11] Patent Number: 5,544,093
[45] Date of Patent: Aug. 6, 1996

[54] DUAL PORT MULTIPLE BLOCK MEMORY CAPABLE OF TIME DIVISIONAL OPERATION

[75] Inventor: Toshiyuki Ogawa, Hyogo-ken, Japan

[73] Assignee: Mitsubishi Denki Kabushiki Kaisha, Tokyo, Japan

[21] Appl. No.: 364,036

[22] Filed: Dec. 23, 1994

Related U.S. Application Data

[63] Continuation of Ser. No. 969,536, Oct. 30, 1992, abandoned, which is a continuation of Ser. No. 460,485, Jan. 3, 1990, abandoned.

[30] Foreign Application Priority Data

Jan. 7, 1989 [JP] Japan ..................... 64-1625

[51] Int. Cl.⁶ ..................................... G11C 7/00
[52] U.S. Cl. ............... 365/189.01; 365/154; 365/189.05; 365/230.03; 365/230.05
[58] Field of Search .......... 365/230.03, 230.05, 365/230.04, 230.09, 239, 221, 189.04, 51, 205, 154, 189.05, 230.06, 189.01

[56] References Cited

U.S. PATENT DOCUMENTS

| | | | |
|---|---|---|---|
| 4,347,587 | 8/1982 | Rao ........................... | 365/189.02 |
| 4,616,310 | 10/1986 | Dill et al. ................... | 365/230.03 |
| 4,701,887 | 10/1987 | Ogawa ........................ | 365/230.09 |
| 4,729,119 | 3/1988 | Dennisons et al. ........... | 365/230.09 |
| 4,731,758 | 3/1988 | Lam et al. .................. | 365/189.05 |
| 4,757,477 | 7/1988 | Nagayama et al. ........... | 365/230.09 |
| 4,769,789 | 9/1988 | Noguchi et al. ............. | 365/219 |
| 4,773,048 | 9/1988 | Kai ........................... | 365/230.03 |
| 4,796,222 | 1/1989 | Aichelmann, Jr. et al. .... | 365/230.03 |
| 4,855,957 | 8/1989 | Nogami ....................... | 365/230.03 |
| 4,855,959 | 8/1989 | Kobayashi .................... | 365/230.09 |
| 4,872,142 | 10/1989 | Hannai ....................... | 365/51 |
| 4,875,196 | 10/1989 | Spaderna et al. ............ | 365/230.04 |
| 4,891,794 | 1/1990 | Hash et al. ................. | 365/230.09 |
| 4,937,788 | 6/1990 | Harada ....................... | 365/230.05 |
| 4,943,947 | 7/1990 | Kobayashi .................... | 365/230.03 |
| 5,138,705 | 8/1992 | Lo et al. .................... | 395/402 |

FOREIGN PATENT DOCUMENTS

| | | |
|---|---|---|
| 59-223994 | 12/1984 | Japan . |
| 62-252590 | 11/1987 | Japan . |

OTHER PUBLICATIONS

J. Nicoud "Video RAMs: Structure and Applications", IEEE Micro Magazine (Feb. 1988), pp. 8–27.
K. Itoh and K. Kimura "Power supply constrainings in megabit DRAMs of the future", Revue de Physique Appliquee (Jan. 1987), pp. 15–19.

Primary Examiner—Jack A. Lane
Attorney, Agent, or Firm—Lowe, Price, LeBlanc & Becker

[57] ABSTRACT

A plurality of bit line pairs are divided into plural bit line groups. Each of the bit line groups comprises two bit line pairs. The two bit line pairs are respectively connected to a common sense amplifier through transistors. The two bit line pairs are respectively connected to a common data register via transistors. Either one of the two bit line pairs is connected to the sense amplifier by a switching signal. In addition, either one of the two bit line pairs is connected to the data register by a data transfer signal. One of the two bit line pairs in one of bit line groups and one of the two bit line pairs in the remaining bit line groups constitute a block. The other of the two bit line pairs in one of bit line groups and the other of the two bit line pairs in the remaining bit line groups constitute another block. A block operation can thus be divisionally carried out.

19 Claims, 15 Drawing Sheets

5,544,093

DUAL PORT MULTIPLE BLOCK MEMORY CAPABLE OF TIME DIVISIONAL OPERATION

CROSS REFERENCE TO RELATED APPLICATION

This application is a continuation of application Ser. No. 07/969,536 filed Oct. 30, 1992, now abandoned, which is a continuation of application Ser. No. 07/460,485 filed Jan. 3, 1990, now abandoned. This application relates to a application Ser. No. 261,021 filed Oct. 10, 1988 and commonly assigned to the assignee of the present invention.

BACKGROUND OF THE INVENTION

1. Field of the Invention

This invention relates to a semiconductor memory device and a method for the operation thereof, and more specifically to a dual port memory equipped with a memory which is accessible in a random sequence and a data register and a method for the operation thereof.

2. Description of the Related Art

FIG. 8 is a block diagram showing the construction of a conventional dual port memory. The dual port memory is provided with a memory cell array which is accessible in a random sequence and in the form of a matrix and a data register which is accessible in a serial sequence. The dual port memory is employed in, for example, a frame memory for a video means.

Referring to FIG. 8, a memory cell array 1 comprises a plurality of memory cells arranged in 512 rows and 512×4 columns. Address signals of $A_0$ to $A_8$ are externally supplied to an address buffer 2. A row decoder 3 receives desired address signals from the address buffer 2 to select data, namely, one of the rows in the memory cell array 1. A column decoder 4 accepts desired address signals from the address buffer 2 to choose data, namely, four of the columns in the memory cell array 1. Both data in memory cells which have been selected both by the row decoder 3 and the column decoder 4 are outputted to a data input/output terminal r through a sense amplifier and I/O control circuit 5 and an I/O buffer 6. In addition, 4 bits data of $WIO_0$ to $WIO_3$ supplied to the data input/output terminal r are inputted to memory cells selected by the row decoder 3 and the column decoder 4 via the I/O buffer 6 and the sense amplifier and I/O control circuit 5.

On the other hand, a data register 7 is constructed of plural registers arranged for each row. Data are transferred row by row between the data register 7 and the memory cell array 1. An address pointer 8 receives signals outputted from the address buffer 2 and processes the same ready for output. A serial data selector 9 accepts outputs of the address pointer 8 to select 4-bits data for the data register 7. The serial data selector 9 is composed of a shift register which successively selects the 4-bits for the data register 7 or is composed of a decoder which chooses the 4-bits data for the data register 7 in response to the address signals. A serial I/O buffer 10 is operated to transfer serial input/output data of $SIO_0$ to $SIO_3$ between the serial data selector 9 and a data input/output terminal s.

A timing generator 11 externally accepts a row address strobe signal $\overline{RAS}$, a column address strobe signal $\overline{CAS}$, a write per bit signal $\overline{WB}$ and/or write enable signal $\overline{WE}$, a data transfer signal $\overline{DT}$ and/or output enable signal $\overline{OE}$, a serial control signal SC a serial enable signal $\overline{SE}$ so as to produce various timing signals for controlling the operation of each device.

FIG. 9 is a circuit diagram illustrating the construction of a principal part of a memory cell array included in a dual port memory. To explain a conventional dual port memory as shown in FIG. 8 and to simplify explanation of succeeding embodiments, FIG. 9 includes a specific circuit of register DR and a specific structure of transfer gate 12 for connecting the register DR to bit lines. However, such specific circuit of register DR and specific structure of transfer gate 12 for connecting the register DR to bit lines are a part of the present invention.

The memory cell array 1 is provided with a plurality of bit line pairs, namely, paired bit lines BL and $\overline{BL}$. A plurality of word lines and two dummy word lines are arranged to extend across these paired bit lines BL and $\overline{BL}$. The word lines of $X_0$ to $X_3$ and dummy word lines of $DX_0$ and $DX_1$ are shown in FIG. 9. Each memory cell MC is provided at an intersection of each word line and each bit line BL or $\overline{BL}$. In addition, dummy cells DC are provided at an intersection of the dummy word line $DX_0$ and the bit line $\overline{BL}$ and at an intersection of the dummy word line $DX_1$ and the bit line BL. The plural word lines are electrically connected to the row decoder 3.

Also connected to each of the paired bit lines BL and $\overline{BL}$ is a sense amplifier SA composed of P-channel MOS transistors $Q_1$ and $Q_2$ and N-channel MOS transistors $Q_3$ and $Q_4$. A sense amplifier unit 50 is constructed of plural sense amplifiers SA. Each of the paired bit lines BL and $\overline{BL}$ is connected to a pair of data input/output lines DIO and $\overline{DIO}$ through N-channel MOS transistors $Q_5$ and $Q_6$. A column selection signal is applied to gates of the transistors $Q_5$ and $Q_6$ from the column decoder 4. An I/O control circuit 60 is constructed of the plural transistors $Q_5$ and $Q_6$. On the other hand, each of precharge circuits PR composed of N-channels MOS transistors Q7 and Q8 is connected to the respective paired bit lines BL and $\overline{BL}$. The plural pre-charge circuits PR constitutes a pre-charge circuit unit 70.

Connected to each bit line BL via respective N-channel MOS transistors $Q_9$ is a register DR composed of N-channel MOS transistors $Q_{10}$, $Q_{11}$ and $Q_{12}$ and inverters $G_1$ and $G_2$. A transfer gate 12 is constructed of the plural transistors $Q_9$. The plural registers DR set up a data register 7. Data lines DL and $\overline{DL}$ of each of the registers DR are connected to a pair of serial input/output lines SIO and $\overline{SIO}$ through the transistors $Q_{11}$ and $Q_{12}$. A selection signal is supplied to common gates of the transistors $Q_{11}$ and $Q_{12}$ of the respective registers DR from each of selector circuits SL. The plural selector circuits SL constitute a serial data selector 9.

A description will next be made on the operation of a dual port memory shown in FIGS. 8 and 9 with reference to timing charts illustrated in FIGS. 10 and 11.

FIG. 10 is a timing chart for describing a read transfer in the dual port memory. The read transfer means that data read out from each memory cell MC is transferred to the data register 7.

Referring to FIG. 10, the paired bit lines BL and $\overline{BL}$ have been precharged up to a given precharge potential $V_{BL}$ at a time $t_0$ by the precharge circuit unit 70. This potential $V_{BL}$ is equal to, for example, one-half the power-supply potential $V_{cc}$, namely, a potential of ½ $V_{cc}$. When an equalizing signal EQ is next rendered "L" level (low level) at a time $t_1$, the paired bit lines BL and $\overline{BL}$ reach a floating state. At a time $t_2$, a potential of one of the plural word lines is raised up by the row decoder 3. A potential of the word line $X_0$ is caused to rise up to "H" level (high level) by way of example.

Consequently, data in each of the memory cells MC, which is connected to the word line $X_0$, are read out to its corresponding bit line BL. A capacitance of each bit line is established at values on the order of usually 10 to 20 times the capacitance of each memory cell. Therefore, a slight potential difference on the order of 100 mV occurs between the paired bit lines BL and $\overline{BL}$. At the same time, a dummy cell read-out signal RDO changes from "H" level to "L" level. The dummy cell read-out signal RDO varies in phase opposite to the potential of the word line $X_0$ with a view toward cancelling noises caused by a capacities coupling of the bit lines at the time of change of the potential of the word line $X_0$ to "H" level.

Sense amplifier activation signals SP and SN, which are inputted to the sense amplifier unit 50, are gradually changed to "H" level and "L" level at a time $t_3$ respectively. Thus, a slight potential difference produced between the bit line pairs BL and $\overline{BL}$ is detected by the sense amplifier SA. At a time $t_4$, either one of the paired bit lines BL and $\overline{BL}$ is potentially rendered "H" level completely, while the potential of the other thereof is fully rendered "L" level. The detection of data which have been read out from each memory cell MC is thus terminated.

Although the reading of the data in each memory cell MC is completed at this time, data on each bit line are transmitted to each data register 7 via the transfer gate 12 during a read transfer cycle. A register transfer signal RT is caused to change to "L" level at a time $t_5$. As a consequence, the data line DL is electrically disconnected from the inverter $G_1$ in each register DR. At the same time, the data transfer signal DT is caused to change to "H" level. Consequently, the data at each bit line BL is transferred to each data line DL without competing with the data of each register DR. At a time $t_6$, the data transfer signal DT is then rendered "L" level while the register transfer signal RT is rendered "H" level, whereby an electrical disconnection between the individual bit lines and each data line is established to return each register DR to a stable state.

At a time $t_7$, a potential at the word line $X_0$ is rendered "L" level while the dummy cell read-out signal RDO is set to "H" level. As a consequence, a sequential read-out operation is completed and the data which have been read out are stored again in each memory cell MC. When the equalizing signal EQ reaches "H" level at a time $t_8$, each of the bit line pairs BL and $\overline{BL}$ is precharged again to be the precharge potential $V_{BL}$.

FIG. 11 is a timing chart for describing a write transfer in the dual port memory. The write transfer is concerned with a transfer of data in the data register 7 to each bit line BL contrary to the read transfer.

The capacity of each bit line BL is greater than for each register DR as much as 5 to 10 times. It is therefore difficult to transfer data from each register DR to each of the bit lines BL after operation of the respective sense amplifiers. Upon performance of the write transfer, the data transfer signal DT is usually rendered "H" level before operation of each sense amplifier SA. Consequently, a slight potential difference is produced at each bit line BL by data stored in each register DR and the respective sense amplifiers SA are thereafter activated.

Referring to FIG. 11, each of the bit line pairs BL and $\overline{BL}$ is precharged to be a precharge potential $V_{BL}$ ($\frac{1}{2} \cdot V_{cc}$ electric potential) at a time $t_0$. An equalizing signal EQ is next rendered "L" level at a time $t_1$. Thus, the paired bit lines BL and $\overline{BL}$ reach a floating state. When the electric potential at the word line $X_0$ and the dummy cell read-out signal RDO are caused to change at a time $t_2$, data stored in each memory cell MC are read out to each bit line BL in the same manner as in the read transfer. As a result, a slight potential difference produces between the paired bit lines BL and $\overline{BL}$. However, in the write transfer unlike the read transfer, a data transfer signal DT is rendered "H" level and a register transfer signal RT is kept "H" level simultaneously. Consequently, data of each of the registers DR through the data line DL are transferred to each bit line BL via each transistor $Q_9$ of the transfer gate 12. An electric charge feeding capacity through the data line DL is greater than that through each bit line BL. As a result, a slight potential difference is produced between the paired bit lines BL and $\overline{BL}$ by the data of each register DR.

Sense amplifier activation signals SP and SN are caused to change at a time $t_3$, so that each sense amplifier SA is activated. As a consequence, the slight potential difference between the bit line pairs BL and $\overline{BL}$ is amplified. At a time $t_4$, one of the paired bit lines BL and $\overline{BL}$ is potentially rendered "H" level completely while the voltage of the other thereof is completely rendered "L" level, thereby leading to completion of the data detection.

The write transfer is caused to return to an initial state at times $t_5$ and $t_6$ in the same manner as in the read transfer.

On the other hand, in a conventional dynamic RAM (which is referred to as Random Access Memory), charging and discharging operations are carried out for each bit line by sense amplifiers upon reading out of data from each memory cell. An electric power consumed by the charge and discharge for each bit line is as much as 80% to 90% of the power consumed in the dynamic RAM. Accordingly, the power consumption can be reduced to substantially half by dividing a single unit of a memory cell array and a sense amplifier unit into two and then separately operating them.

A dual port memory which performs divisionally two-block operations (namely, ½ division operation) may be considered, for example, the construction shown in FIG. 12. In order to facilitate its description, a precharge circuit unit, a data selector and an I/O control circuit are omitted from the construction in FIG. 12. In addition, wirings to be connected between adjacent blocks are also omitted therefrom.

The dual port memory illustrated in FIG. 12 is provided with a block A comprising a memory cell array 1a, a row decoder 3a, a column decoder 4a, a sense amplifier unit 50a, a transfer gate 12a and a data register 70a and a block B including a memory cell array 1b, a row decoder 3b, a column decoder 4b, a sense amplifier unit 50b, a transfer gate 12b and a data register 70b. Either one of the blocks A and B is operated for each read-out cycle. Likewise, either one of the blocks A and B is also activated even during the read transfer cycle and write transfer cycle.

Incidentally, data in each memory cell are read out to each bit line by rendering a potential at any one of word lines "H" level during the data read-out cycle and the voltage at each bit line is amplified to be set to "H" level or "L" level by the operation of each sense amplifier. Thus, in the memory cell array in an inactive state, the row decoders are also provided separately since it is necessary to set a selection signal for each word line to "L" level state.

In the dual port memory shown in FIG. 12, data can bi-directionally be transferred between the memory cell array and the data register in internal units of the blocks A and B in accordance with the read and write transfers. It is, however, not possible transmit or receive the data between the two blocks A and B. For instance, after data stored in the memory cell array 1b within the block B have been read-transferred to the data register 70b, the data cannot be write-transferred to the memory cell array 1a in the block A.

SUMMARY OF THE INVENTION

It is an object of this invention to permit at least two-block divisional operations and to make possible bi-directional transfer data between adjacent blocks in a semiconductor memory device.

It is another object of this invention to make possible divisional operation of memory cell array blocks; in accordance with a selection of word lines and to allow data to be bi-directionally transferred between plural blocks and common data registers without providing complicated wiring patterns in the dual port memory.

It is a further object of this invention to provide an operation method for the semiconductor memory device which permits at least two-block divisional operations and makes possible to bi-directionally transfer data between blocks.

It is still further object of this invention to provide an operation method for a dual port memory which makes possible to divisionally operate memory cell array blocks in accordance with a selection of word lines and allows data to be bi-directionally transferred between plural blocks and common data registers without providing complicated wiring patterns.

The semiconductor memory device according to the present invention comprises first and second memory arrays, a common data register, and first and second transfer means. Each of memory array includes a plurality of memory cells. The first and second transfer means are provided between the first memory array and the common data register and between the second memory array and the common data register, respectively. Thereby, the common data register provides a communication link between the first and second memory arrays.

In accordance with another aspect of the present invention, a semiconductor memory device is provided with a memory cell array, selection means, a plurality of data holding means and connecting means. Each memory cell array comprises plural bit line pairs, a plurality of word lines arranged intersecting with the plural bit line pairs and plural memory cells provided at intersections of the plural bit line pairs and the plural word lines.

The memory cell array is divided into plural bit line groups. Each of the bit line groups includes plural bit line pairs of the same number. The plural bit line pairs included in any one of the bit line groups correspond to the plural bit line pairs included in the remaining bit line groups respectively, whereby plural combinations are constructed; a combination being the corresponding bit line pairs in all groups. Each of the plural combinations includes bit line pairs corresponding to each other in the plural bit line groups. Each of the plural word lines is associated with any one of the plural combinations. Each memory cell is provided at an intersection of each word line and each bit line pair included in the combination corresponding to the word line.

A plurality of data holding means are provided corresponding to the plural bit line groups. The selection means selects any one of the plurality of word lines. A connecting means connects the bit line pairs included in the combination corresponding to the word line selected by the selection means, to the corresponding data holding means.

In the semiconductor memory device according to this invention, the bit line pairs corresponding to each other in the plural bit line groups constitutes one of plural combinations. The plural combination constitute a plurality of memory cell array blocks, respectively. In addition, each of the plurality of word lines is associated with any one of these plural combinations. Thus, when any one of the plurality of word lines is selected, its corresponding combination is selected. As a consequence, the memory cell array blocks can divisionally be operated by the selection of each word line.

In addition, the data holding means is provided corresponding to each of the bit line groups. In each of the bit line groups, a bit line pair which belongs to a selected combination, is connected to the corresponding data holding means. Accordingly, data can be transferred between the plural memory cell array blocks and the common data holding means.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiment of this invention will hereinafter be described with reference to the accompanying drawings.

Figure 13:
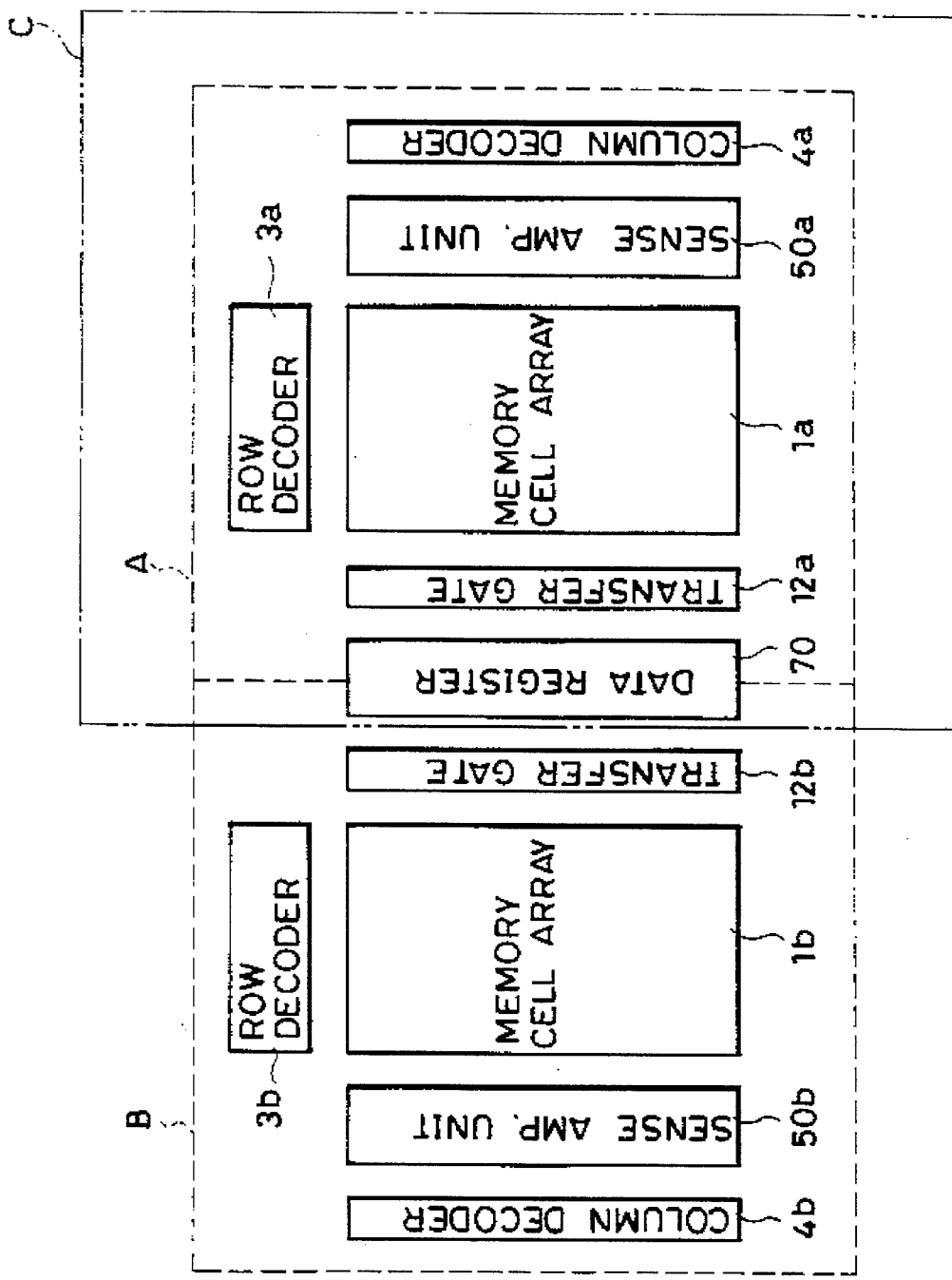
FIG. 13 is a block diagram showing the construction of a dual port memory which permits two-block divisional operations and is capable of transferring data bi-directionally between the blocks.

FIG. 13 illustrates a dual port memory, according to one embodiment of the present invention, which can bi-directionally transfer data to each other between blocks A and B. The blocks A and B are provided with a data register 70 in common in the dual port memory shown in FIG. 13. As a matter of course, the data transfer can bi-directionally be carried out between a memory cell array 1a and a memory cell array 1b through the data register 70.

Figure 14:
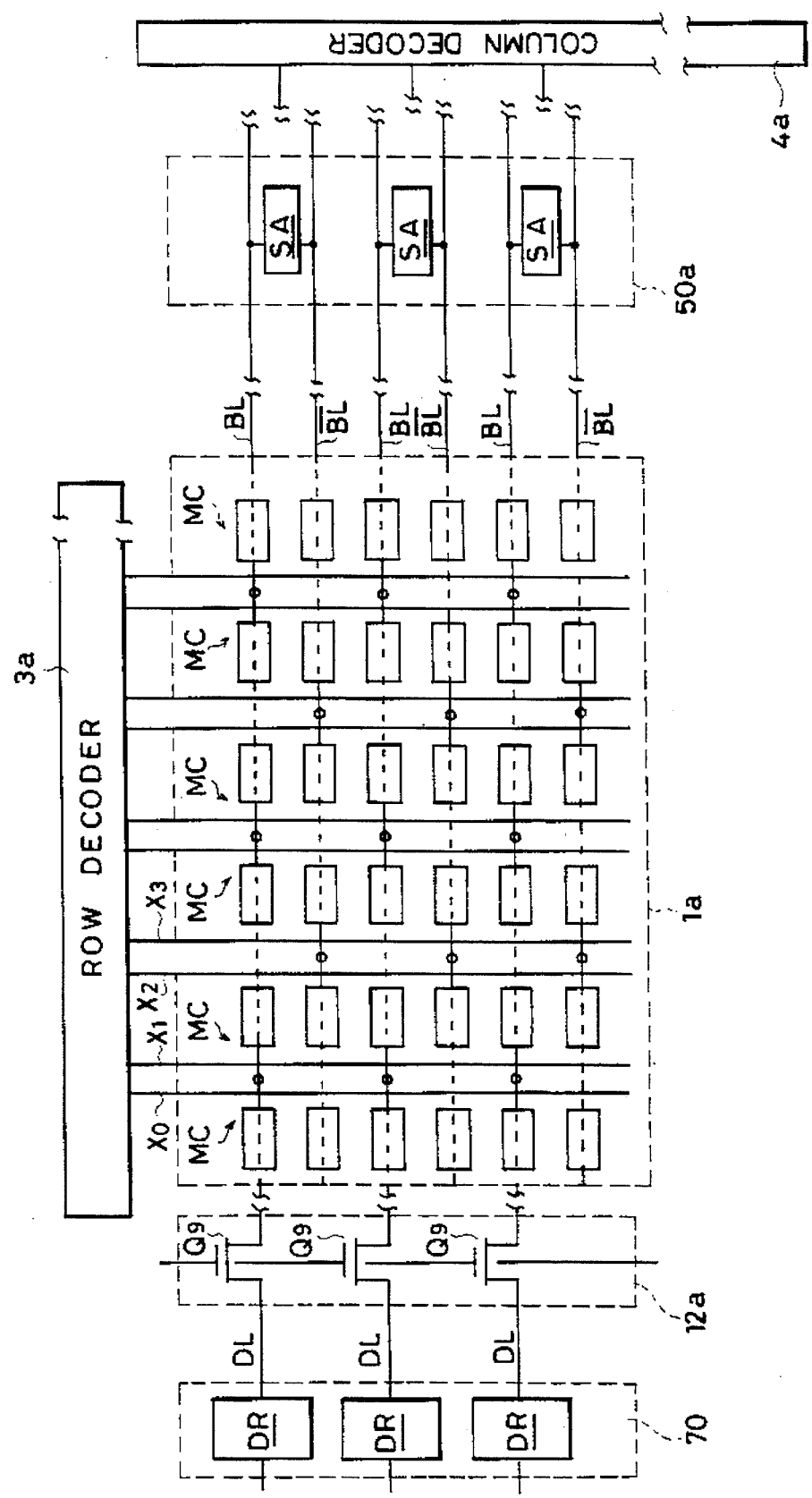
FIG. 14 is a circuit diagram illustrating the construction of one of the blocks in FIG. 13.

FIG. 14 typically illustrates the construction of a section C shown in FIG. 13. A planar pattern of the memory cell array 1a is typically illustrated in FIG. 14.

Referring to FIG. 14, the memory cell array 1a is arranged such that plural bit line pairs BL and $\overline{BL}$ and a plurality of word lines of $X_0$ to $X_3$ are crossed with one another. Connected to the plural bit line pairs BL and $\overline{BL}$ is a sense amplifier unit 50a composed of a plurality of sense amplifiers SA. In addition, the plural bit lines BL are connected to a data register 70 constructed of plural registers DR through a transfer gate 12a which consists of a plurality of N-channel MOS transistors Q9.

Figure 15A:
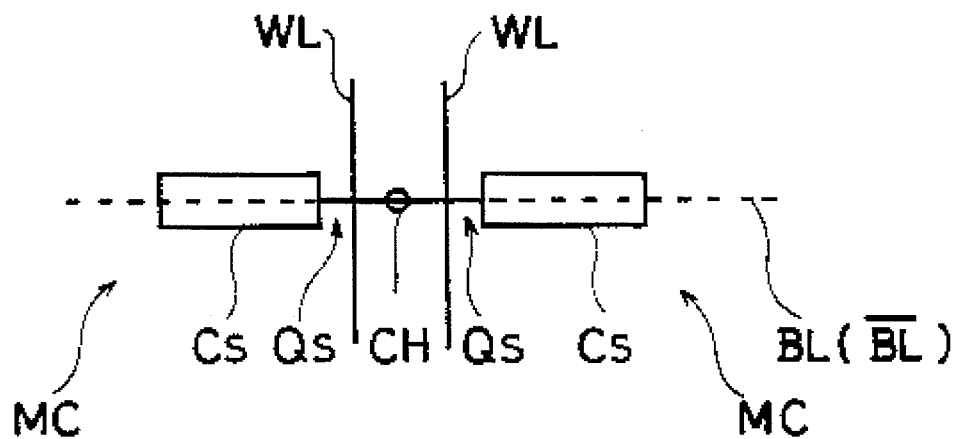
FIG. 15A typically illustrates a planar pattern of two memory cells.

FIG. 15A typically illustrates a planar pattern of two memory cells MCs which are included in the memory cell array 1a of FIG. 14. In addition, FIG. 15B is a circuit diagram which corresponds to the memory cells of FIG. 15A.

Figure 15B:
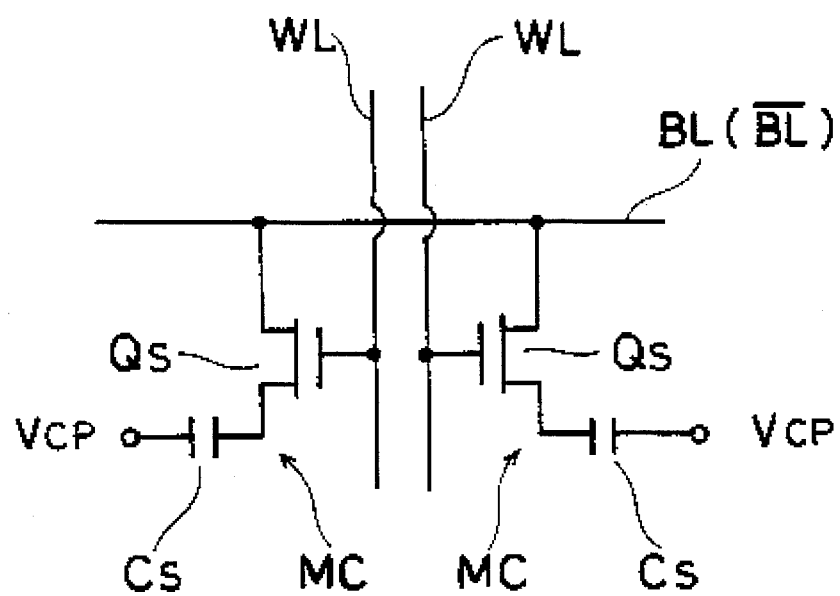
FIG. 15B is a circuit diagram which corresponds to the memory cells of FIG. 15A.

Referring to FIGS. 15A and 15B, each memory cell MC consists of a cell capacitor Cs and an access transistor Qs. One of electrodes of the cell capacitor Cs is connected to a bit line BL through the access transistor Qs and a contact hole CH. The other electrode thereof receives a cell plate potential VCP. Connected to each word line WL is a gate electrode of the access transistor Qs.

As has been described above, the data can bi-directionally be transferred between the blocks A and B in the dual port memory shown in FIG. 13. The dual port memory is however accompanied by a drawback that although the two-block operations (namely, ½ division operation) can be divisionally performed, at least three-block operations cannot be divisionally carried out. Namely, although it is easy to provide two blocks relative to a single data register 70, the provision of at least three blocks relative to one data register becomes difficult.

Figure 2:
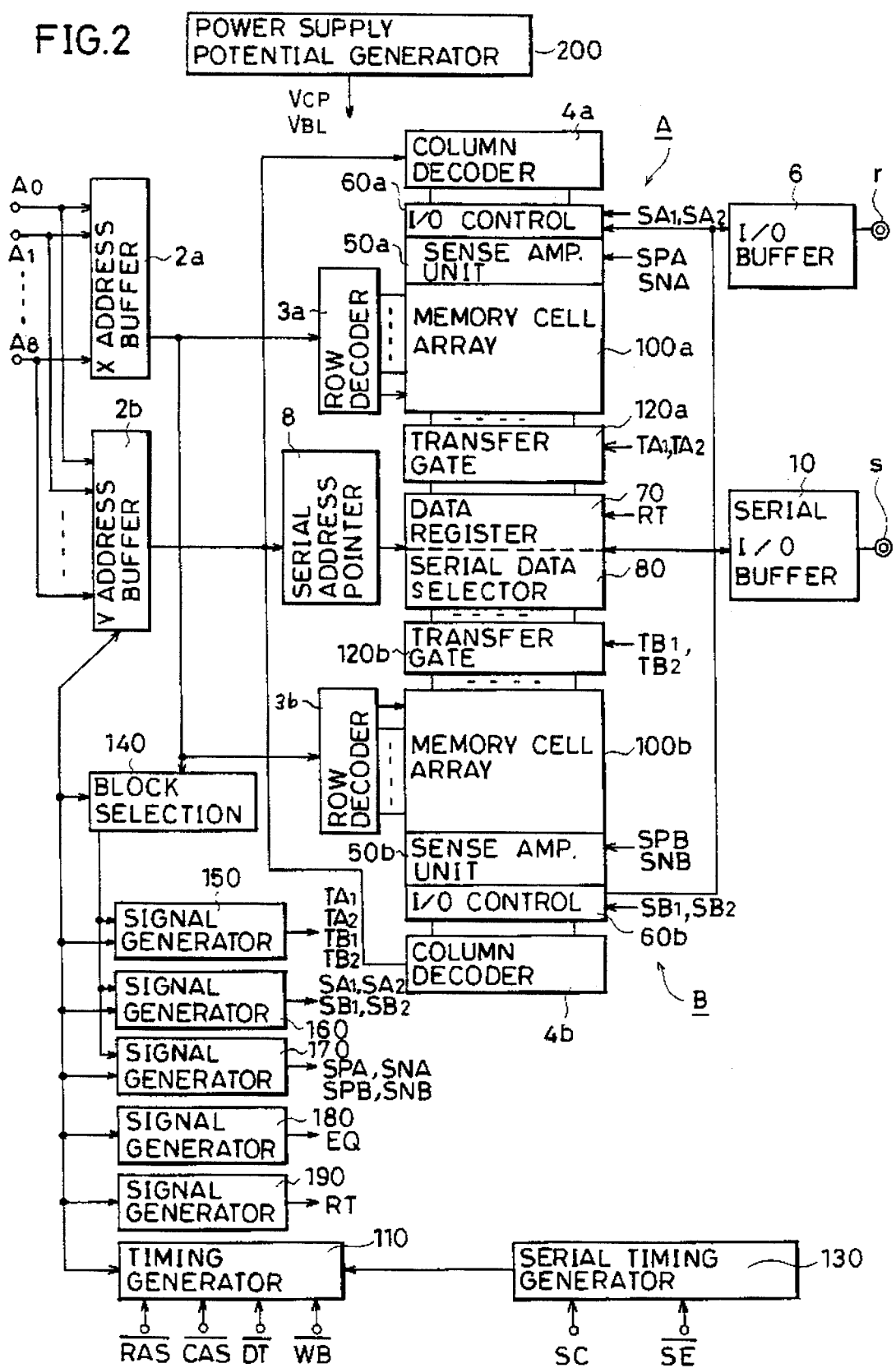
FIG. 2 is a block diagram showing the overall construction of the dual port memory according to the embodiment of FIG. 1.

FIG. 2 is a block diagram illustrating the overall construction of a dual port memory according to another embodiment of this invention.

The dual port memory comprises blocks A and B. The block A is composed of a memory cell array 100a, a row decoder 3a, a column decoder 4a, a sense amplifier unit 50a, an I/O control circuit 60a and a transfer gate 120a. Likewise, the block B has a memory cell array 100b, a row decoder 3b, a column decoder 4b, a sense amplifier unit 50b, an I/O control circuit 60b and a transfer gate 120b. The blocks A and B have a data register 70 and a serial data selector 80 in common.

An X address buffer 2a externally receives address signals of $A_0$ to $A_8$ and their signals are then supplied to the row decoders 3a and 3b and a block selection circuit 140 at a predetermined timing. A Y address buffer 2b externally accepts address signals of $A_0$ to $A_8$ and the signals are then supplied to the column decoders 4a and 4b and a serial address pointer 8 at a predetermined timing. The row decoders 3a and 3b respond to address signals so as to select any one of plural rows in the memory cell arrays 100a and 100b respectively. The column decoders 4a and 4b respond to address signals so as to select any one of plural columns in the memory cell arrays 100a and 100b respectively. An I/O buffer 6 is actuated to transfer an input/output data between the I/O control circuit 60a and a data input/output terminal r and between the I/O control circuit 60b and the terminal r.

On the other hand, data are transferred row by row via the transfer gate 120a between the memory cell array 100a and the data register 70. Likewise, data are transferred row by row via the transfer gate 120b between the memory cell array 100b and the data register 70. The serial data selector 80 accepts outputs of the serial address pointer 8 to select any one of bit data in the data register 70. This selector 80 is constructed of a shift register or decoder. The serial I/O buffer is operated to transfer a serial input/output data between the data register 70 and a data input/output terminal s.

A timing generator 110 externally receives a row address strobe signal $\overline{RAS}$, a column address strobe signal $\overline{CAS}$, a data transfer signal $\overline{DT}$ and a write per bit signal $\overline{WB}$ so as to produce various timing signals for controlling the operation of each device. In addition, a serial timing generator 130 accepts a serial control signal SC and a serial enable signal $\overline{SE}$ so as to generate various timing signals for principally controlling a serial operation. The block selection circuit 140 outputs a block selection signal in response to each of the timing signals outputted of the timing generator 110 and each of the address signals outputted from the X address buffer 2a. A signal generator 150 generates each of data transfer signals $TA_1$, $TA_2$, $TB_1$ and $TB_2$ in response to a block selection signal and each of the timing signals.

A signal generator 160 outputs each of switching signals $SA_1$, $SA_2$, $SB_1$ and $SB_2$ in response to a block selection signal and each of the timing signals. A signal generator 170 generates each of sense amplifier activation signals SPA, SNA, SPB and SNB responsive to a block selection signal and each of the timing signals. A signal generator 180 outputs an equalizing signal EQ in response to each of the timing signals. A signal generator 190 generates a register transfer signal RT in response to each of the timing signals. Incidentally, a power supply potential generator 200 outputs a cell plate potential $V_{CP}$ and a precharge potential $V_{BL}$.

Figure 1:
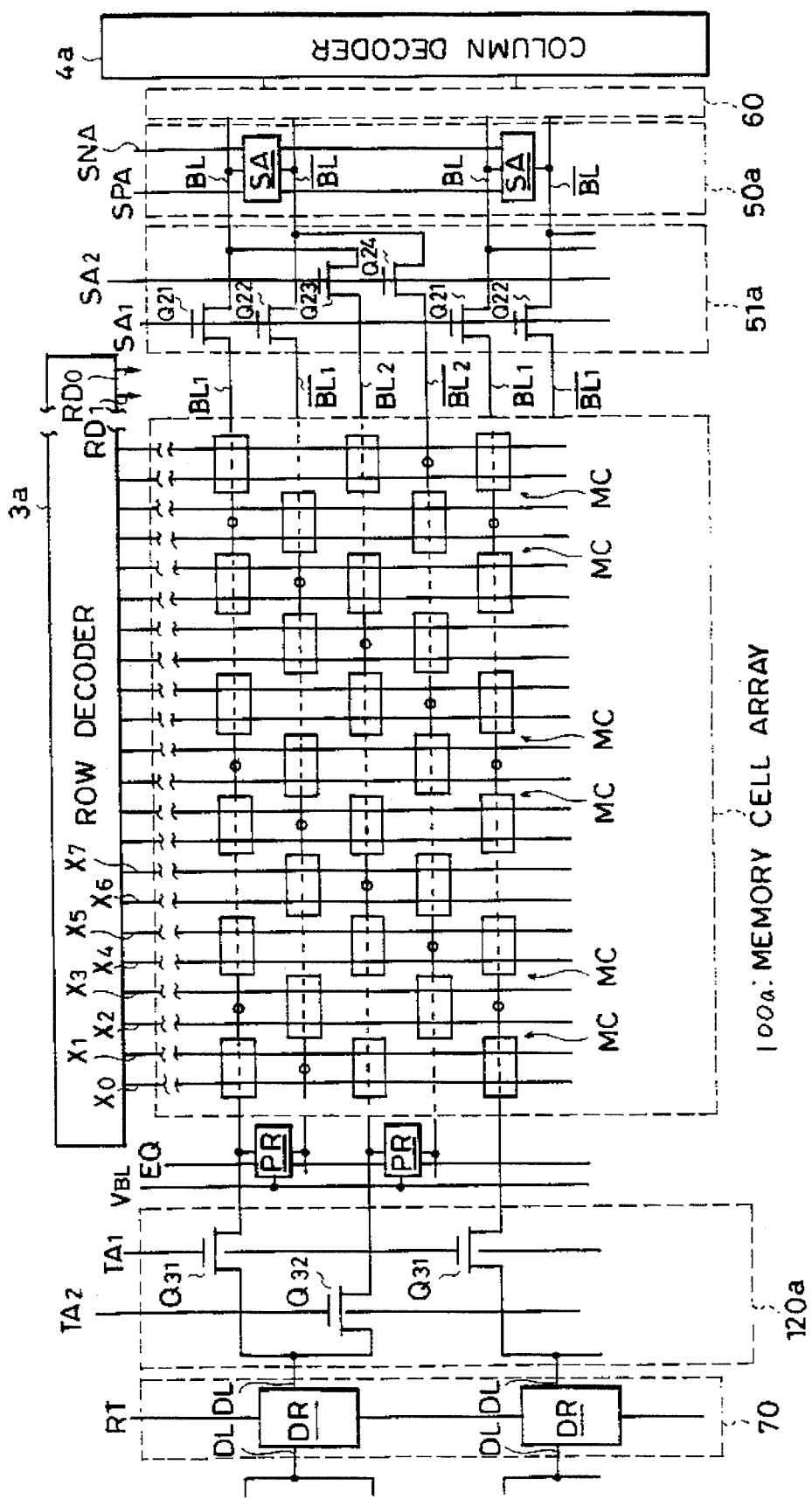
FIG. 1 is a circuit diagram illustrating the construction of a principal part of a dual port memory according to one embodiment of this invention.

FIG. 1 is a circuit diagram showing the construction of the principal portion of the block A in FIG. 2.

A planar pattern of the memory cell array 100a is typically illustrated in FIG. 1. The circuit construction of each memory cell MC is similar to that shown in FIG. 15B. Although each dummy cell DC is omitted in FIG. 1, the construction thereof is similar to that of each memory cell MC.

In the memory cell array 100a, paired bit lines $BL_1$ and $\overline{BL_1}$ and paired bit lines $BL_2$ and $\overline{BL_2}$ constitute a single bit line group. A plurality of bit line groups are arranged in the memory cell array 100a. In each of the bit line groups, the paired bit lines $BL_1$ and $\overline{BL_1}$ and the paired bit lines $BL_2$ and $\overline{BL_2}$ are provided adjacent to each other. The paired bit lines $BL_1$ and $\overline{BL_1}$ are connected to paired bit lines BL and $\overline{BL}$ via N-channel MOS transistors $Q_{21}$ and $Q_{22}$. In addition, the paired bit lines $BL_2$ and $\overline{BL_2}$ are coupled to the paired bit lines BL and $\overline{BL}$ through N-channel MOS transistors $Q_{23}$ and $Q_{24}$. A switching signal $SA_1$ is applied to each gate of the MOS transistors $Q_{21}$ and $Q_{22}$ while another switching signal $SA_2$ is supplied to each gate of the MOS transistors $Q_{23}$ and $Q_{24}$. A plurality of the transistors $Q_{21}$, $Q_{22}$, $Q_{23}$ and $Q_{24}$ constitute a switching circuit 51a. Each sense amplifier SA is connected to each of the paired bit lines BL and $\overline{BL}$. The construction of each sense amplifier SA is similar to that shown in FIG. 9. Sense amplifier activation signals SPA and SNA are supplied to each sense amplifier SA.

On the other hand, precharge circuits PR are connected to the paired bit lines $BL_1$ and $\overline{BL_1}$ and the paired bit lines $BL_2$ and $\overline{BL_2}$ respectively. The construction of each of the precharge circuits PR is similar to that shown in FIG. 9. The bit lines $BL_1$ and $BL_2$ are connected to data lines DL registers DR via N-channel MOS transistors $Q_{31}$ and $Q_{32}$ respectively. A data transfer signal $TA_1$ is applied to each gate of the transistors $Q_{31}$ while another data transfer signal $TA_2$ is supplied to each gate of the transistors $Q_{32}$. The transfer gate 120 is composed of a plurality of the transistors $Q_{31}$ and $Q_{32}$. In addition, the construction of each register DR is the same as that illustrated in FIG. 9. A plurality of the registers DR constitute each of the data registers 70.

In the memory cell array 100a, each memory cell MC is provided at a point at which each of the word lines $X_0$ and $X_1$ crosses the bit line $\overline{BL_1}$, at a point where each of the word lines $X_2$ and $X_3$ crosses the bit line $BL_1$, at a point at which each of the word lines $X_4$ and $X_5$ crosses the bit line $\overline{BL_2}$ and at a point at which each of the word lines $X_6$ and $X_7$ crosses the bit line $BL_2$. In other words, each memory cell MC is arranged at each point at which each word line crosses every fourth bit line.

Figure 9:
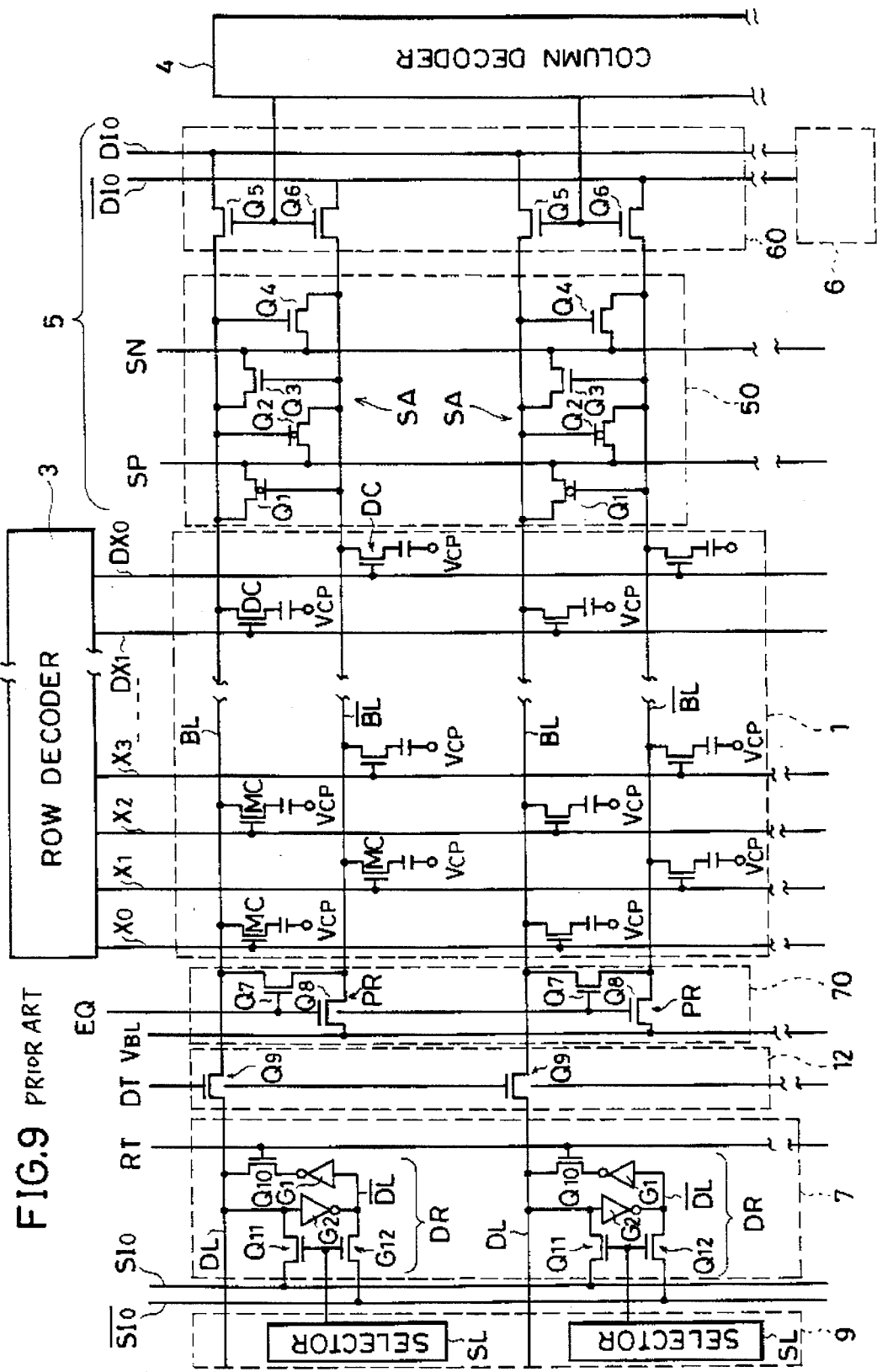
FIG. 9 is a circuit diagram illustrating the construction of a main portion of a dual port memory.

Incidentally, although each of the bit lines $\overline{BL_1}$ and $\overline{BL_2}$ is not connected to each register DR as viewed in FIG. 1, each of the bit lines $\overline{BL_1}$ and $\overline{BL_2}$ may be connected to each of the data lines $\overline{DL}$ in the registers DR (see FIG. 9).

Incidentally, the construction of the block B shown in FIG. 2 corresponds to that illustrated in FIG. 1. The block B is however, provided with the sense amplifier activation signals SPB and SNB, switching signals $SB_1$ and $SB_2$ and data transfer signals $TB_1$ and $TB_2$ as an alternative to the sense amplifier activation signals SPA and SNA, switching signals $SA_1$ and $SA_2$ and data transfer signals $TA_1$ and $TA_2$. For example, when the data transfer signal $TA_1$ is rendered "H" level in the block A, the data transfer signals $TB_1$ and $TB_2$ are rendered "L" level in the block B.

Referring to FIG. 1, when the switching signal $SA1_1$ is rendered "H" level, the paired bit lines $BL_1$ and $\overline{BL_1}$ are connected to the corresponding sense amplifier SA. When the switching signal $SA_2$ reaches "H" level, the paired bit lines $BL_2$ and $\overline{BL_2}$ are electrically connected to the sense amplifier SA. When the data transfer signal $TA_1$ is rendered "H" level, each bit line $BL_1$ is connected to each register DR. When the data transfer signal $TA_2$ reaches "H" level on the contrary, each bit line $BL_2$ is coupled to each register DR. Namely, a plurality of the paired bit lines $BL_1$ and $\overline{BL_1}$ forms one block and the plural paired bit lines $BL_2$ and $\overline{BL_2}$ constitute another block. Accordingly, two blocks are included in the block A corresponding to the construction shown in FIG. 1. As a result, four blocks are included in the dual port memory depicted in FIG. 2.

The operation of the dual port memory according to this embodiment will next be described with reference to each timing chart of FIGS. 3 and 4.

Figure 3:
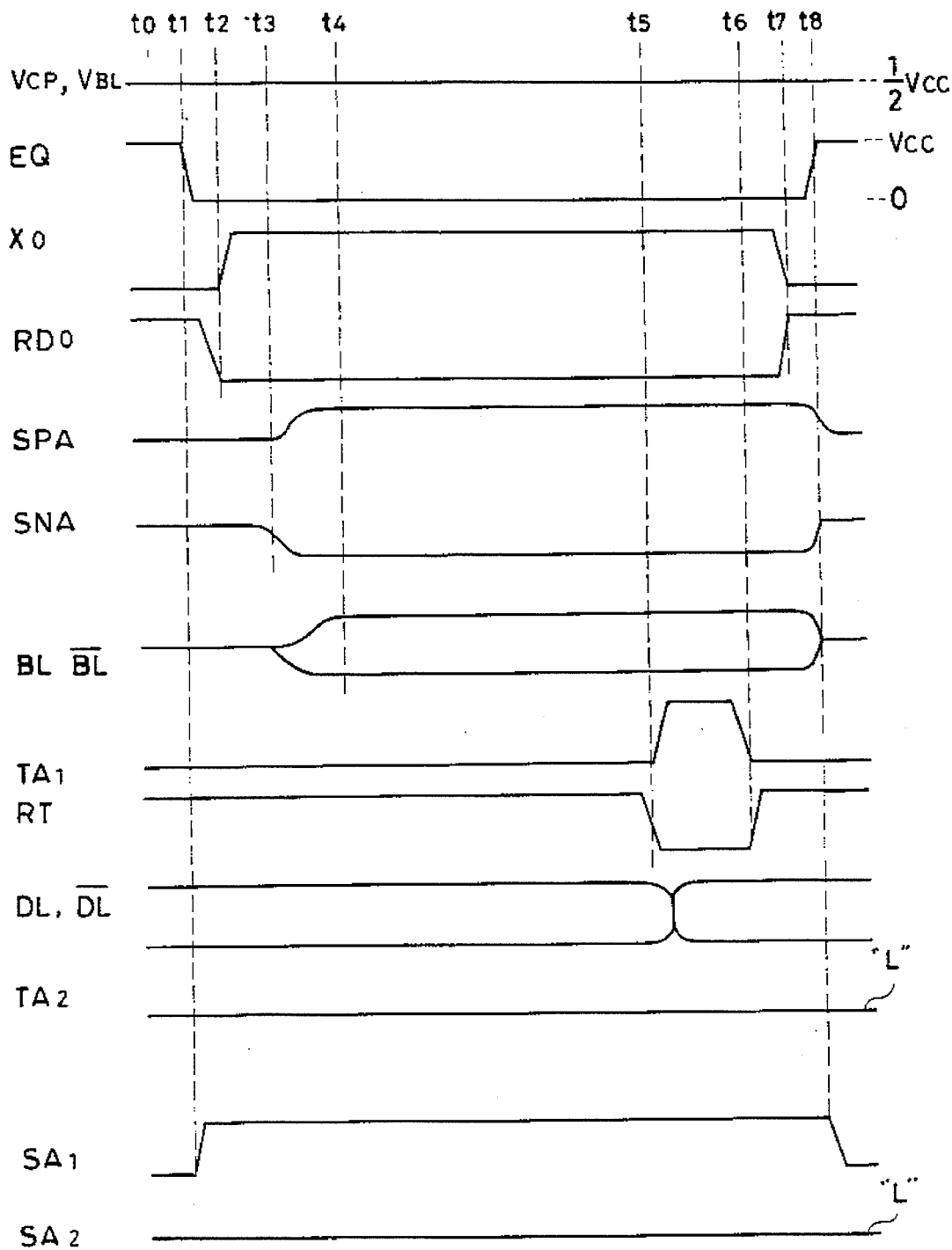
FIG. 3 is a timing chart for describing a read transfer which is for the dual port memory of FIG. 1.

FIG. 3 is a timing chart for describing a read transfer for the dual port memory.

Referring to FIG. 3, at a time $t_0$, the paired bit lines $BL_1$ and $\overline{BL_1}$ and the paired bit lines $BL_2$ and $\overline{BL_2}$ have been precharged up to a precharge potential $V_{BL}$ by a precharge circuit PR. When an equalizing signal EQ is next rendered "L" level at a time $t_1$, the paired bit lines $BL_1$ and $\overline{BL_1}$ and the paired bit lines $BL_2$ and $\overline{BL_2}$ reach a floating state. At the same time, a switching signal $SA_1$ is caused to rise up to "H" level. Consequently, the paired bit lines $BL_1$ and $\overline{BL_1}$ are connected to the bit lines BL and $\overline{BL}$. At this time, a switching signal $SA_2$ is kept "L" level.

A potential at a word line $X_0$ is rendered "H" level at a time $t_2$. Data of each memory cell MC connected to the word line $X_0$ are read out to each bit line $BL_1$. As a consequence, a slight potential difference is produced between the bit lines BL and $\overline{BL}$. At the same time, a dummy cell read out signal RDO varies from "H" level to "L" level. Then, sense amplifier activation signals SPA and SNA reach "H" level and "L" level respectively at a time $t_3$. Thus, one of the paired bit lines BL and $\overline{BL}$ is potentially rendered "H" level while the potential of the other thereof reaches "L" level. The reading of the data in each memory cell MC is thus terminated.

A register transfer signal RT reaches "L" level at a time $t_5$ and at the same time, a data transfer signal $TA_1$ is changed to "H" level. Consequently, data on each bit line $BL_1$ are transferred to each of the data lines DL. At this time, a data transfer signal $TA_2$ is kept "L" level.

The data transfer signal $TA_1$ and the register transfer signal RT are next rendered "L" level and "H" level at a time $t_6$ respectively. As a consequence the bit line $BL_1$ and the data line DL are electrically disconnected from each other, so that each register DR is caused to return to stable state. At a time $t_7$, the word line $X_0$ is rendered "L" level and the dummy cell read out signal RDO reaches "H" level. A sequential operation for the reading is terminated based on the above described manner and the data read out are stored again in each memory cell MC. When the equalizing signal EQ is rendered "H" level at a time $t_8$, the paired bit lines $BL_1$ and $\overline{BL_1}$ and paired bit lines $BL_2$ and $\overline{BL_2}$ are precharged again up to the precharge potential $V_{BL}$. At the same time, the switching signal $SA_1$ is changed to "L" level.

Figure 4:
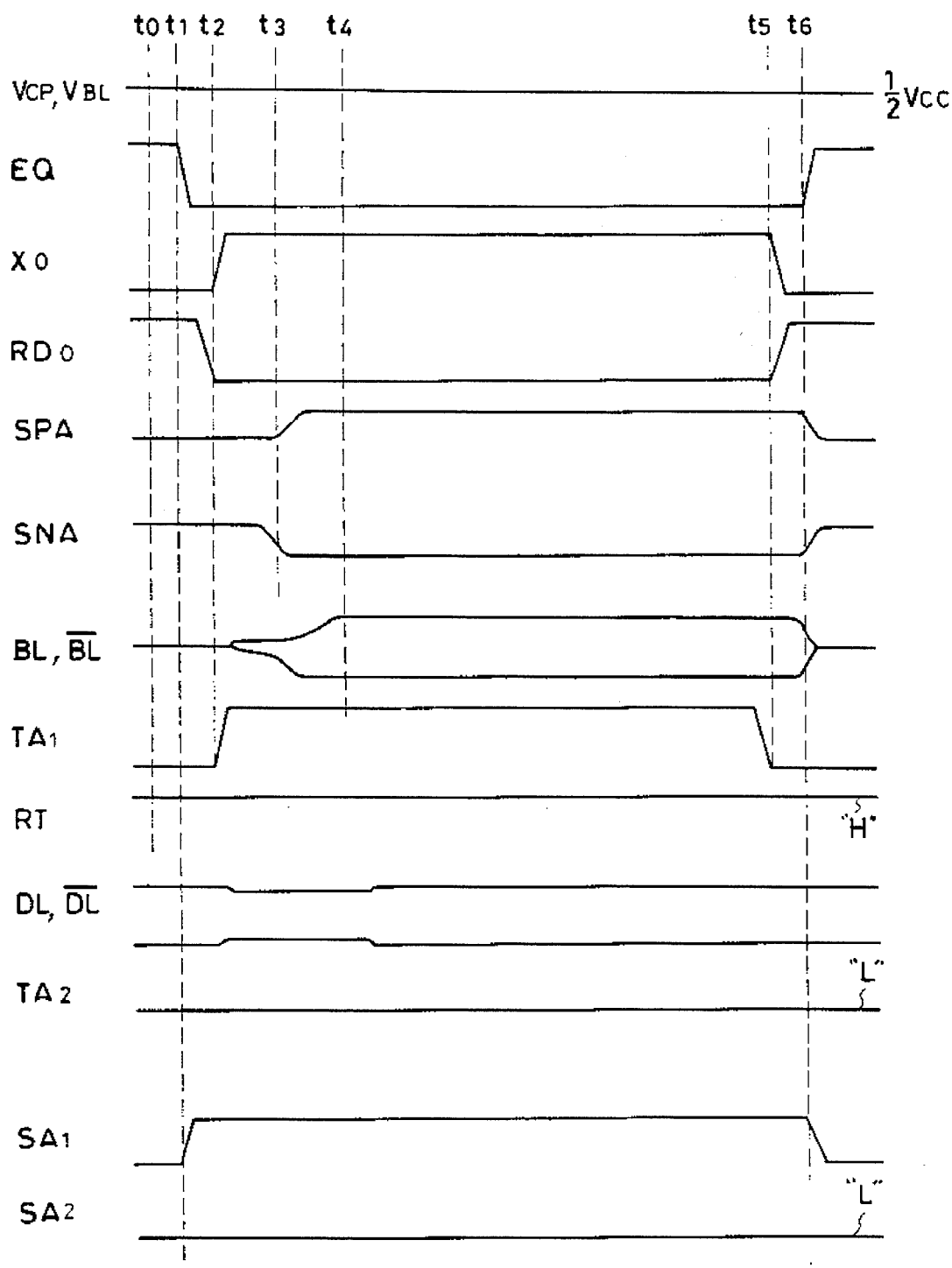
FIG. 4 is a timing chart for describing a write transfer for the dual port memory of FIG. 1.

FIG. 4 is a timing chart for describing a write transfer for the dual port memory.

Referring to FIG. 4, the paired bit lines $BL_1$ and $\overline{BL_1}$ and paired bit lines $BL_2$ and $\overline{BL_2}$ have been precharged up to a precharge potential $V_{BL}$ at a time $t_0$. When an equalizing signal EQ next reaches "L" level at a time $t_1$, the paired bit lines $BL_1$ and $\overline{BL_1}$ and paired bit line $BL_2$ and $\overline{BL_2}$ are set to a floating state. At the same time, a switching signal $SA_1$ is raised to "H" level. Consequently, the paired bit lines $BL_1$ and $\overline{BL_1}$ are connected to the paired bit lines BL and $\overline{BL}$ respectively. At this time, a switching signal $SA_2$ is kept "L" level.

When a potential at a word line $X_0$ and a dummy cell read out signal RDO are changed at a time $t_2$, data in each memory cell MC are read out to the bit line $BL_1$ in the same manner as in the read transfer. As a consequence, a potential difference is slightly produced between the bit lines BL and $\overline{BL}$. At the same time, a data transfer signal $TA_1$ is raised to "H" level, whereby the bit line BL is connected to each data line DL in each of the registers DR. At this time, a data transfer signal $TA_2$ is kept "L" level. In addition, unlike the read transfer, a register transfer signal RT is kept "H" level. A slight potential difference is hence produced by data stored in each register DR between the bit lines BL and $\overline{BL}$.

Next, sense amplifier activation signals SPA and SNA is changed at a time $t_3$, so that each sense amplifier SA is activated. As a result, the slight potential difference between the bit lines BL and $\overline{BL}$ is amplified. At a time $t_4$ one of the paired bit lines BL and BL is potentially rendered "H" level completely while the potential of the other thereof is fully rendered "L" level, whereby the data detection is completed.

The write transfer is caused to return to an initial state at times $t_5$ and $t_6$ in the same manner as in the read transfer.

Figure 10:
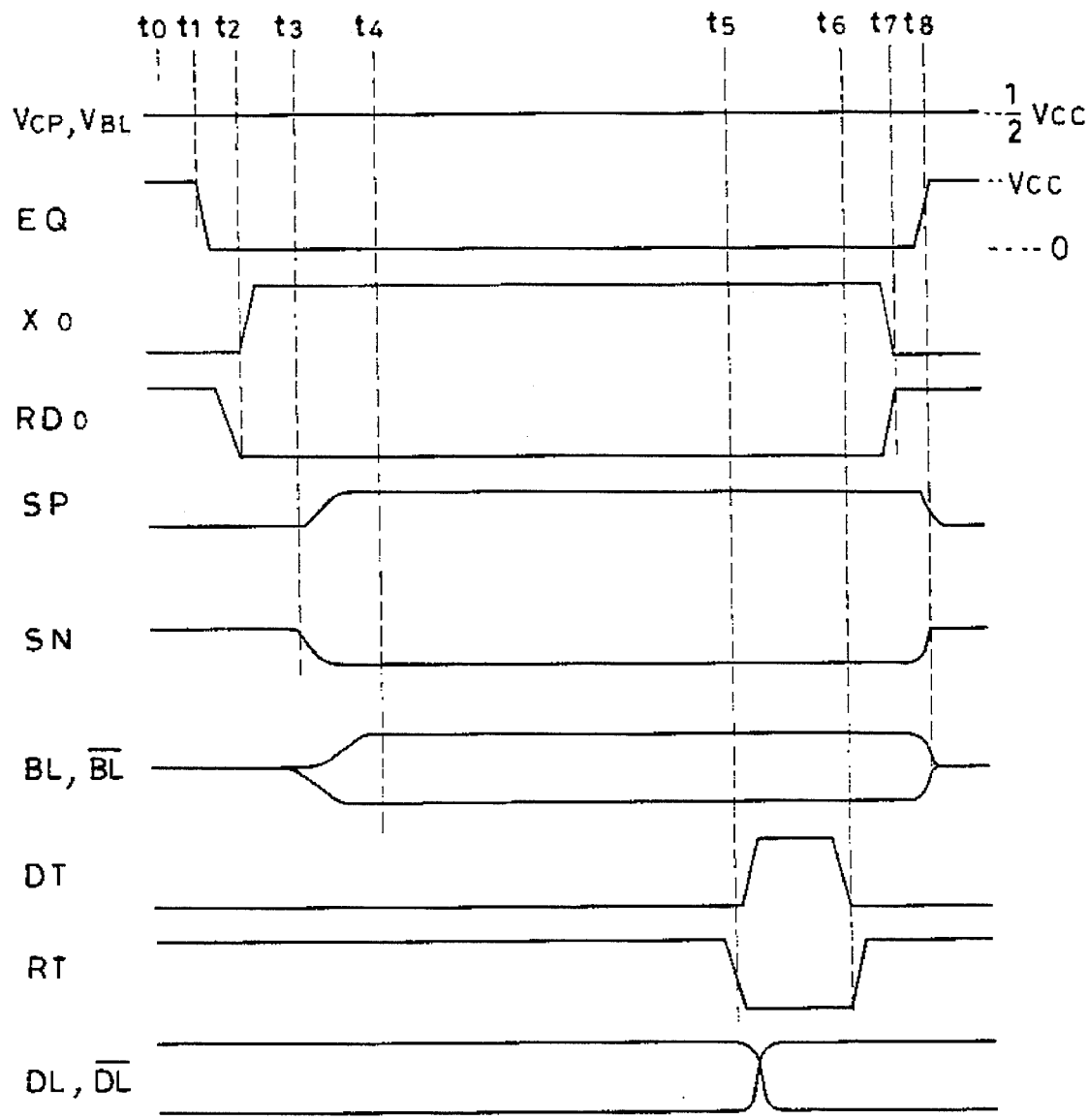
FIG. 10 is a timing chart for describing a read transfer for the dual port memory of FIG. 9.
Figure 11:
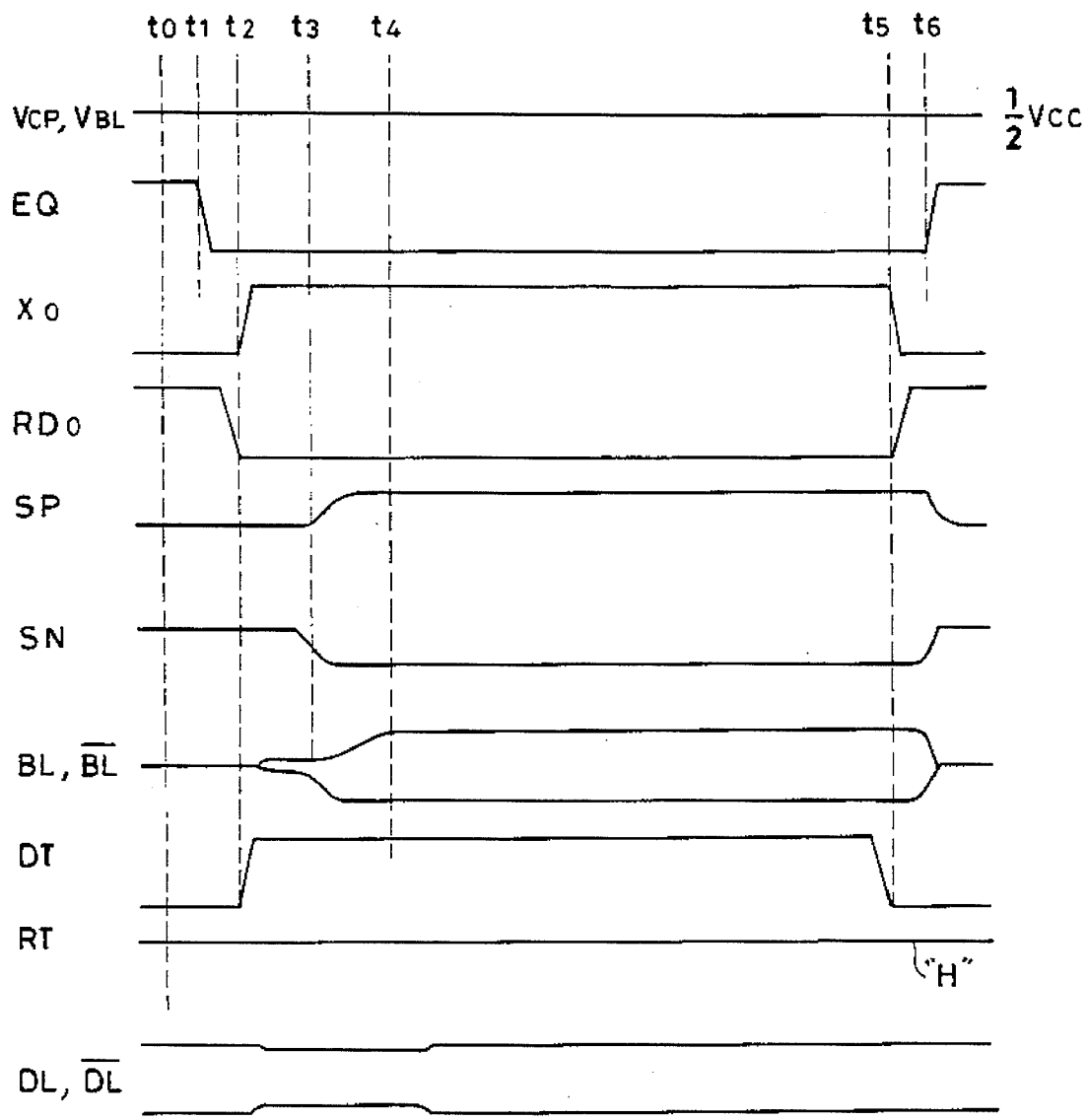
FIG. 11 is a timing chart for describing a write transfer for the dual port memory of FIG. 9.
Figure 12:
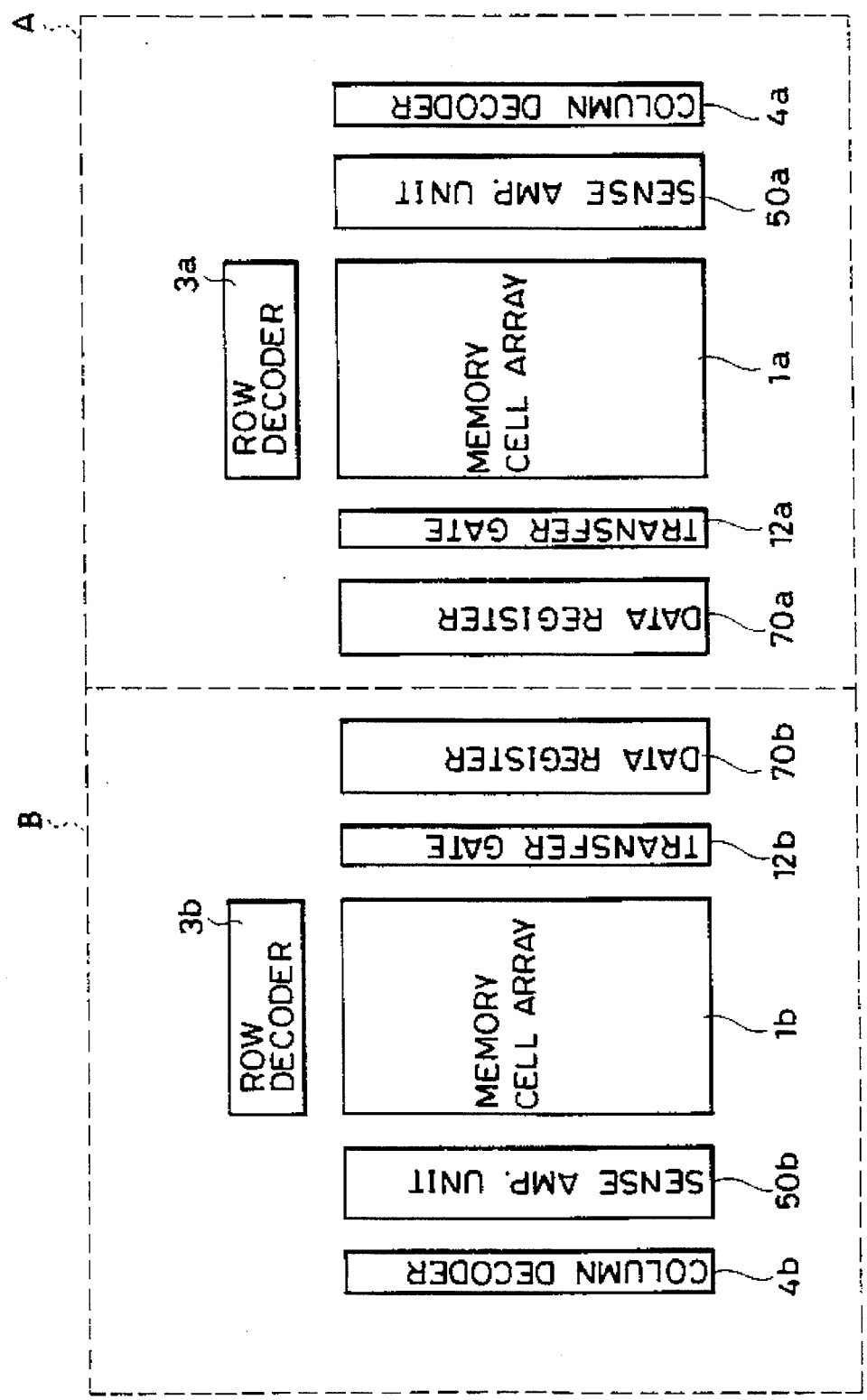
FIG. 12 is a block diagram illustrating the construction of a dual port memory which allows two blocks to operate divisionally.

It should be noted that FIGS. 10 and 11 differ from FIGS. 3 and 4, respectively, only in lower three waveforms $TA_2$, $SA_1$ and $SA_2$. These waveforms provide selectivity at transfer gates 120a and switching circuits 51a.

In the above described embodiment, the selection of each word line permits selection of any one of the plural bit line pairs $BL_1$ and $\overline{BL_1}$ and plural bit line pairs $BL_2$ and $\overline{BL_2}$. The selected bit lines pairs are connected to the sense amplifiers SA respectively by setting the switching $SA_1$ or switching signal $SA_2$ to "H" level. Accordingly, one-half the plural bit line pairs included in the memory cell array is activated. In addition, the selected bit line pairs are connected to the registers DR respectively by setting the data transfer signal $TA_1$ or data transfer signal $TA_2$ to "H" level, whereby data are transferred between the selected bit line pairs and each register DR.

Accordingly, two-block operations (namely, ½ division operation) can be divisionally performed in each of the blocks A and B. In addition, the selected paired bit lines can be connected to a common data registers 70. As a result, the dual port memory shown in FIG. 2 permits four-block divisional operations (namely, ¼ division operation).

Figure 5:
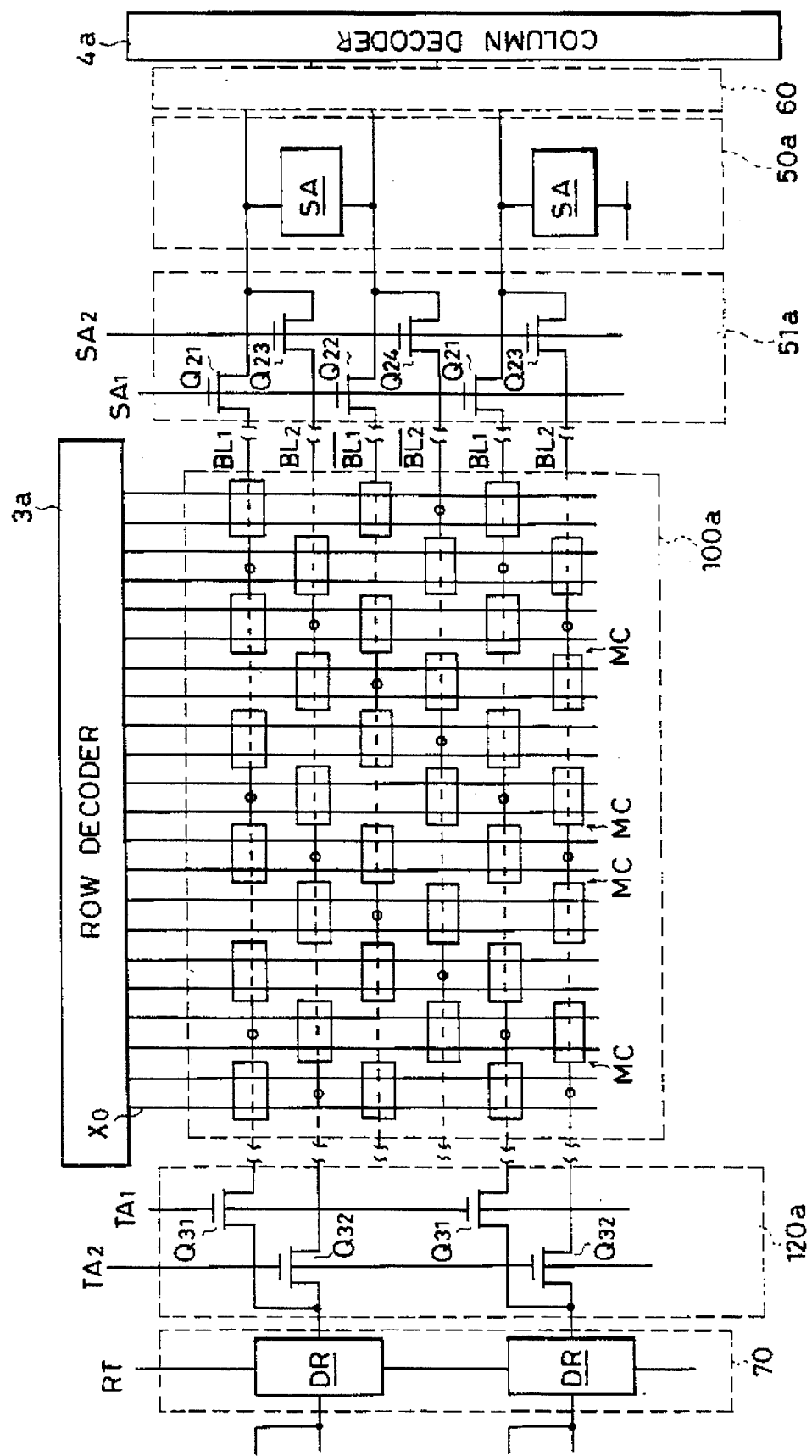
FIG. 5 is a circuit diagram illustrating the construction of a principal part of a dual port memory according to another embodiment of this invention.

FIG. 5 is a circuit diagram illustrating the construction of a principal part of a dual port memory according to further embodiment of this invention.

The dual port memory of this embodiment is constructed such that four-block operations can be divisionally carried out in the same manner as in the dual port memory shown in FIG. 1. In the present embodiment, bit lines $BL_1$ and $BL_2$ are provided adjacent to each other, while bit lines $\overline{BL_1}$ and $\overline{BL_2}$ are arranged adjacent to each other said bit lines $BL_1$, $BL_2$ and $\overline{BL_1}$ and $\overline{BL_2}$ being included in one bit line group. The other constructions of the dual port memory are similar to those of the dual port memory shown in FIG. 1.

Figure 6:
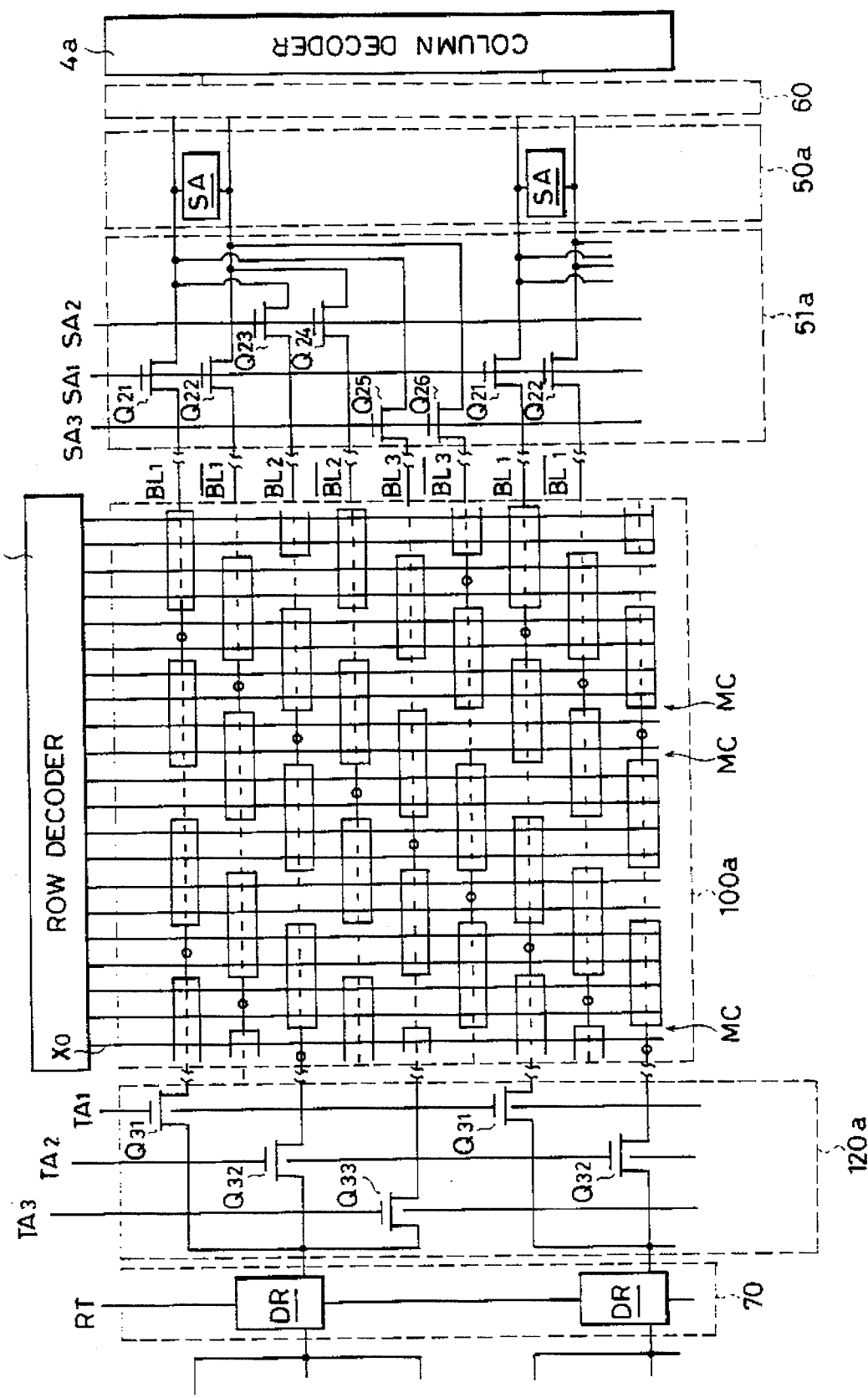
FIG. 6 is a circuit diagram showing the construction of a principal part of a dual memory according to a further embodiment of this invention.

FIG. 6 is a circuit diagram showing the construction to a still another embodiment of this invention.

A memory cell array 100a illustrated in FIG. 6 is constructed such that three-block operations (namely, ⅓ division operation) can be divisionally performed. As a consequence, the dual port memory according to this embodiment permits six-block divisional operations (namely, ⅙ division operation).

Referring to FIG. 6, one bit line group comprises a pair of bit lines $BL_1$ and $\overline{BL_1}$, a pair of bit lines $BL_2$ and $\overline{BL_2}$ and a pair of bit lines $BL_3$ and $\overline{BL_3}$. The paired bit lines $BL_1$ and $\overline{BL_1}$, the paired bit lines $BL_2$ and $\overline{BL_2}$ and the paired bit lines $BL_3$ and $\overline{BL_3}$ are arranged in order in each bit line group. The paired bit lines $BL_3$ and $\overline{BL_3}$ additionally connected to bit line pairs BL and $\overline{BL}$ through N-channel MOS transistors $Q_{25}$ and $Q_{26}$. A switching signal $SA_3$ is supplied to each gate of the MOS transistors $Q_{25}$ and $Q_{26}$. On the other hand, each bit line $BL_3$ is connected to each of data lines DL of registers DR via each of N-channel MOS transistors $Q_{33}$. A data transfer signal $TA_3$ is applied to each transistor $Q_3$.

Figure 7:
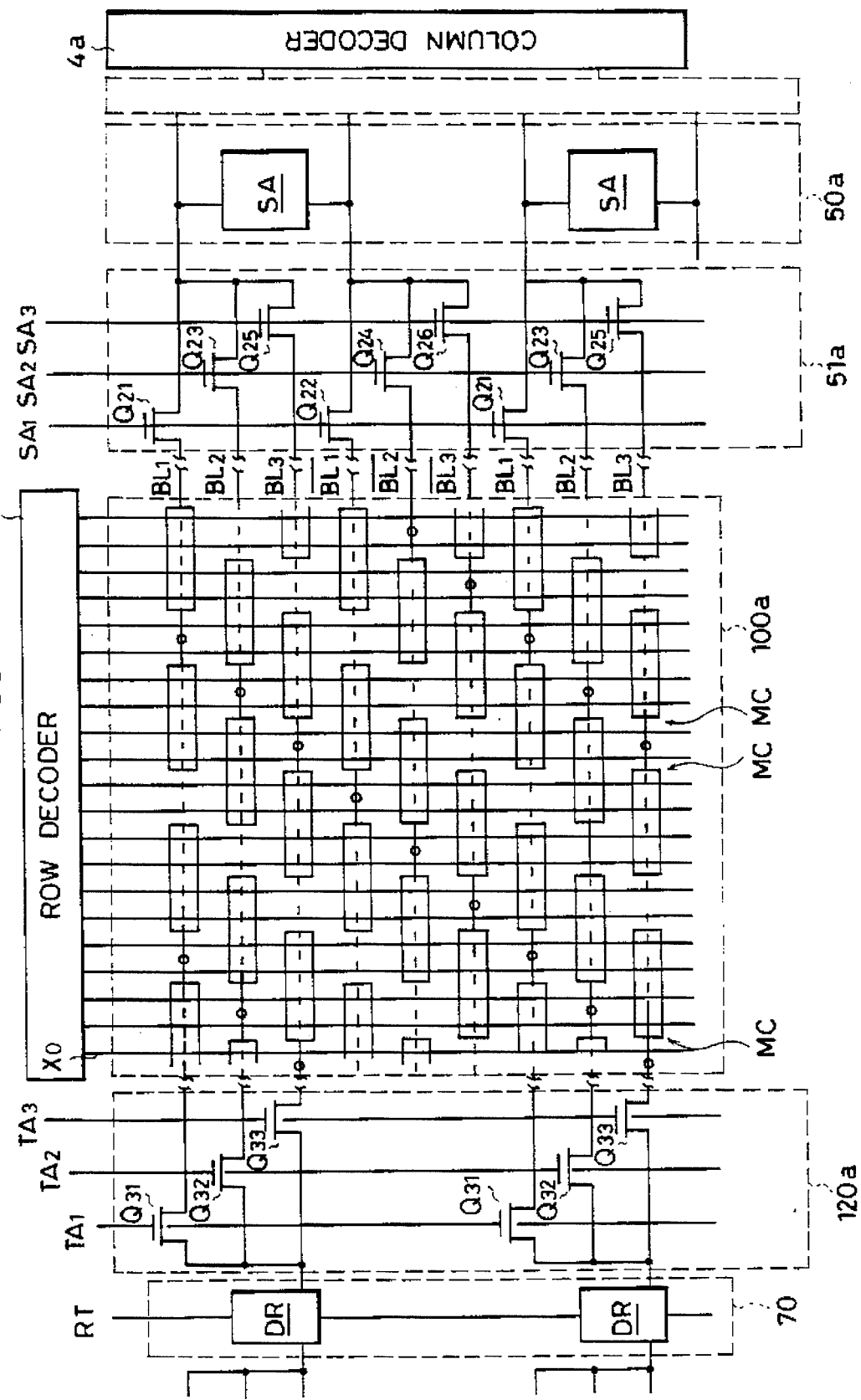
FIG. 7 is a circuit diagram illustrating the construction of a principal part of a dual port memory according to a still further embodiment of this invention.
Figure 8:
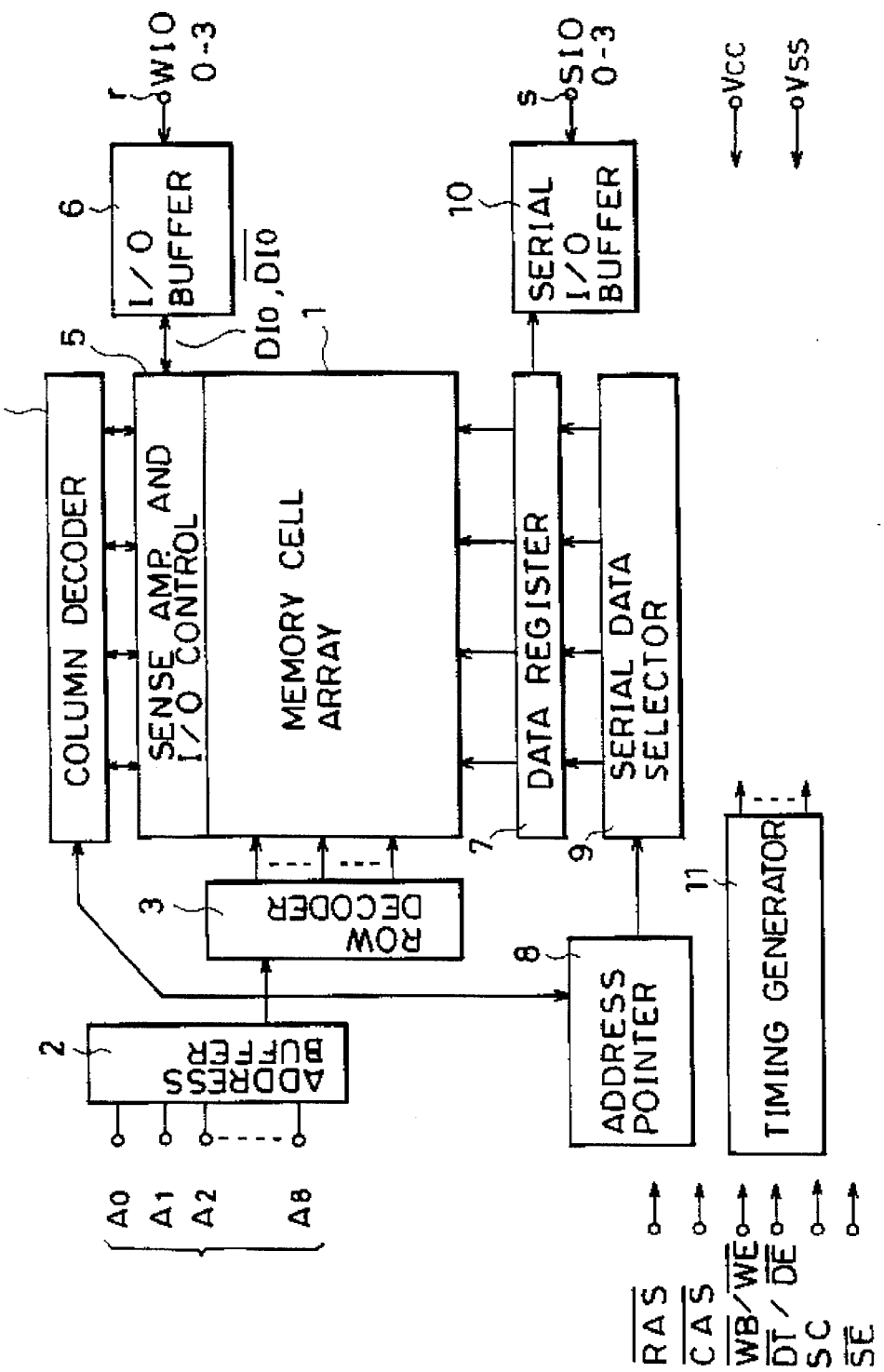
FIG. 8 is a block diagram showing the construction of a dual port memory.

FIG. 7 is a circuit diagram illustrating the construction of a principal part of a dual port memory according to a still further embodiment of this invention.

The dual port memory according to this embodiment is constructed such that six-block operations can be divisionally carried out in the same manner as in the dual port memory shown in FIG. 6. In the present embodiment, bit lines $BL_1$, $BL_2$ and $BL_3$ are provided adjacent to one another, while bit lines $\overline{BL_1}$, $\overline{BL_2}$ and $\overline{BL_3}$ are arranged adjacent to one another, said bit lines $BL_1$, $BL_2$ and $BL_3$ and $\overline{BL_1}$, $\overline{BL_2}$ and $\overline{BL_3}$ being included in one bit line group. The other constructions of the dual port memory in FIG. 7 are similar to those of the dual port memory shown in FIG. 6. It is therefore seen that data can be read from any array into desired location in any other arrays no matter how numerous the array may be.

Two block divisional operation in each memory array can be performed in the memories of FIG. 1 and 5. In the memory of FIG. 5, order of bit lines is different from that in the memory of FIG. 1. Three-block divisional operation in each memory array can be performed in the memories of FIGS. 6 and 7. In the memory of FIG. 7, order of bit lines is different from that in the memory of FIG. 6. Any combination of these memories is possible.

In the dual port memory according to each embodiment of this invention as described above, at least two-block operations can be divisionally performed and data can be transferred between adjacent blocks without complexity of a switching circuit.

According to the present invention as has been described above, each of plural combinations is constructed of bit line pairs corresponding to one another in plural bit line groups, and each word line corresponds to any one of the plural combinations. In addition, a plurality of data holding means are provided corresponding to the plurality of bit line groups, respectively. In each of the bit line groups, a bit line pair which belongs to the selected combination is connected to its corresponding data holding means.

Accordingly, the present invention can provide a semiconductor memory device which makes possible memory cell array block operations performed divisionally in accordance with the selection of each word line and in which data can bi-directionally be transferred between the plural blocks and the common data holding means without complicated interconnection patterns.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    first and second memory arrays each including a plurality of bit line pairs,
    a common data register means shared by said first and second memory arrays for storing a plurality of bits of information, said common data register means including a plurality of data holding means each provided corresponding to a bit line pair,
    first transfer means provided between said first memory array and said common data register means and second transfer means provided between said second memory array and said common data register means, respectively, for simultaneously transferring a plurality of bits between said common data register means and respective memory array, said common data register means providing bidirectional transfer of data between said first and second memory arrays, wherein
    each data holding means includes a latch circuit including two inverters, an input of a first of said two inverters being directly connected to an output of a second of said two inverters, an output of said first of said two inverters being connected to an input of said second of said two inverters through a switching means.

2. A semiconductor memory device comprising;

a first memory cell array including a plurality of memory cells arranged in plural rows and plural columns, plural bit line pairs disposed in said plural columns and connected to a plurality of memory cells in corresponding columns, said plural bit line pairs comprising a plurality of groups or sets each group or set including a plurality of bit line pairs which are simultaneously operated in one operating timing, plural word lines connected to a plurality of memory cells in corresponding rows, a plurality of sense amplifiers each disposed for a predetermined number of bit line pairs, each one from each group or set of said plurality of groups or sets, disposed in a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a second memory cell array including a plurality of memory cells arranged in plural rows and plural columns, plural bit line pairs disposed in said plural columns and connected to a plurality of memory cells in corresponding column, said plural bit line pairs comprising a plurality of groups or sets each group or set including a plurality of bit line pairs which are simultaneously operated in one operating timing, plural word lines connected to a plurality of memory cells in corresponding rows, a plurality of sense amplifiers each disposed for a predetermined number of bit line pairs, each one from each group or set of said plurality of groups or sets, disposed in a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier.

a plurality of data lines disposed corresponding to said plurality of sense amplifiers in said first and second memory cell arrays, each for said predetermined number of adjacent columns in said plural columns in said first and second memory cell arrays, a plurality of data holding means provided corresponding to said plurality of data lines for temporarily holding data, each data holding means having an input/output portion connected to a corresponding data line, a plurality of first transfer means provided corresponding to said plurality of data lines, each selectively connecting to corresponding data line one of the plural bit line pairs corresponding to that data line in said first memory cell array, and a plurality of second transfer means provided corresponding to said plurality of data lines, each selectively connecting to a corresponding data line one of the plural bit line pairs corresponding to that data line in said second memory cell array.

3. The semiconductor memory as claimed in claim 2, wherein each of the plural bit line pairs comprises a first bit line and a second bit line adjacent to the first bit line.

4. The semiconductor memory as claimed in claim 2, wherein each of the plural bit line pairs comprises a first bit line and second bit line, and the plural first bit lines are arranged adjacent to one another and the plural second bit lines are provided adjacent to one another, in the plural bit line pairs corresponding to each sense amplifier.

5. The semiconductor memory as claimed in claim 2, which further comprises a first selection means for selecting any one of said plural word lines, a second selection means for selecting any one of said plural sense amplifier means, and a third selection means for sequentially selecting any one of said plural data holding means.

6. The semiconductor memory as claimed in claim 5, wherein the first selection means comprises a row decoder, the second selection means comprises a column decoder and the third selection means has a serial data selector.

7. A semiconductor memory device as recited in claim 2, wherein each of said plurality of data lines includes a pair of data lines with one data line of each pair of data lines being connected to said first transfer means for bidirectional transfer of data between a bit line of each bit line pair and a corresponding data holding means.

8. A semiconductor memory device comprising:

a first memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a second memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a plurality of data lines disposed corresponding to said plurality of sense amplifiers in said first and second memory cell arrays, each for said predetermined number of adjacent columns in said plural columns in said first and second memory cell arrays, a plurality of data holding means provided corresponding to said plurality of data lines for temporarily holding data, each data holding means having an input/output portion connected to a corresponding data line, a plurality of first transfer means provided corresponding to said plurality of data lines, each selectively connecting to a corresponding data line one of the plural bit line pairs corresponding to that data line in said first memory cell array, and a plurality of second transfer means provided corresponding to said plurality of data lines, each selectively connecting to a corresponding data line one of the plural bit line pairs corresponding to that data line in said second memory cell array, wherein each of said plurality of data lines includes a pair of data line with one data line of each pair of data lines being connected to said first transfer means for bidirectional transfer of data between a bit line of each bit line pair and a corresponding data holding means, and each of said plurality of data holding means further comprises a latch circuit including two inverters, an input of a first of said inverters being directly connected to an output of a second of said inverters and an output of said first of said inverters being connected to an input of said second of said inverters through a switching means.

9. A semiconductor memory device, comprising:

a first memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a second memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a plurality of data lines disposed corresponding to said plurality of sense amplifiers in said first and second memory cell arrays, each for said predetermined number of adjacent columns in said plural columns in said first and second memory cell arrays, a plurality of data holding means provided corresponding to said plurality of data lines for temporarily holding data, each data holding means having an input/output portion connected to a corresponding data line, a plurality of first transfer means provided corresponding to said plurality of data lines, each selectively connecting to a corresponding data line one of the plural bit line pairs corresponding to that data line in said first memory cell array, and a plurality of second transfer means provided corresponding to said plurality of data lines, each selectively connecting to a corresponding data line one of the plural bit line pairs corresponding to that data line in said second memory cell array, wherein each of said plurality of data holding means has an input/output portion for receiving/providing data, each transfer means is provided corresponding to the corresponding plurality of bit line pairs and comprises a plurality of switching devices each having one terminal connected to the input/output portion of the corresponding holding means and other terminal connected to one bit line of the corresponding bit line pair in the corresponding plurality of bit line pairs, and each said data holding means includes
a first inverter having an input node connected to the input/output of the data holding means, and an output node,
a second inverter having an input node and an output node connected to the output node of the first inverter,
a first switching device connected between the output node of the second inverter and said input/output portion,
a second switching device controlled by a serial data selector and connected between the input node of said first inverter and one serial input/output line of a serial input/output line pairs in the serial data selector, and
a third switching device controlled by the serial data selector and connected between the output node of said first inverter and other serial input/output line of the serial input/output line pairs in the serial data selector.

10. A dual port memory comprising:

a first memory cell array including a plurality of memory cells arranged in plural rows and plural columns, plural bit line pairs disposed in said plural columns and connected to a plurality of memory cells in corresponding columns, said plural bit line pairs comprising a plurality of groups or sets each group or set including a plurality of bit line pairs which are simultaneously operated in one operating timing, plural word lines connected to a plurality of memory cells in corresponding rows, a plurality of sense amplifiers each disposed for a predetermined number of bit line pairs, each one from each group or set of said plurality of groups or sets, disposed in a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a second memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a plurality of data lines disposed corresponding to said plurality of sense amplifiers in the first and second memory cell arrays, each for said predetermined number of adjacent columns in the plural rows in said first and second memory cell arrays, a plurality of date holding means provided between said first memory cell array and said second memory cell array and corresponding to said plurality of data lines, each having input/output portion connected to a corresponding data line, for receiving from the first and second memory cell arrays and temporarily holding data therein, a plurality of first transfer means provided corresponding to said plurality of data lines, each selectively connecting to a corresponding data line one of the plural bit line pairs in said first memory cell array corresponding to that data line, and a plurality of transfer means provided corresponding to said plurality of data lines, each selectively connecting to a corresponding data lines one of the plural bit line pairs in said second memory cell array corresponding to that data line.

11. A dual port memory, comprising:

a first memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a second memory cell array including a plurality of memory cells arranged in plural rows and plural columns, plural bit line pairs disposed in said plural columns and connected to a plurality of memory cells in corresponding columns, plural word lines connected to a plurality of memory cells in corresponding rows, a plurality of sense amplifiers each disposed for a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier, a plurality of data lines disposed corresponding to said plurality of sense amplifiers in the first and second memory cell arrays, each for said predetermined number of adjacent columns in the plural rows in said first and second memory cell arrays, a plurality of data holding means provided between said first memory cell array and said second memory cell array and corresponding to said plurality of data lines, each having input/output portion connected to a corresponding data line, for receiving from the first and second memory cell arrays and temporarily holding data therein, a plurality of first transfer means provided corresponding to said plurality of data lines, each selectively connecting to a corresponding data line one of the plural bit line pairs in said first memory cell array corresponding to that data line, and a plurality of transfer means provided corresponding to said plurality of data lines, each selectively connecting to a corresponding data lines one of the plural bit line pairs in said second memory cell array corresponding to that data line wherein each of said plurality of data holding means further comprises a latch circuit including two inverters, an input of a first of said inverters being directly connected to an output of a second of said inverters, an output of said first of said inverters being connected to an input or said second of said inverters through a switching means.

12. A method of operating a semiconductor memory which comprises first and second memory cell arrays each including a plurality of memory cells arranged in plural rows and plural columns, plural bit lines pairs disposed in said plural columns and connected to a plurality of memory cells in corresponding columns, said plural bit line pairs comprising plurality of groups or sets each group or set including a plurality of bit line pairs which are simultaneously operated in one operating timing, plural word lines connected to a plurality of memory cells in corresponding rows, a plurality of sense amplifiers each disposed for a predetermined number of bit line pair, each one from each group or set of said plurality of groups or sets, disposed in a predetermined number of adjacent columns in said plural columns, and each sensing and amplifying potential difference between a bit line pair connected thereto, and a plurality of switching means provided corresponding to said plurality of sense amplifiers, respectively, and each selectively connecting to a corresponding sense amplifier one of the plural bit line pairs corresponding to the sense amplifier;

a plurality of data lines disposed corresponding to said plurality of sense amplifiers in said first and second memory cell arrays, each for said predetermined number of adjacent columns in said plural columns in said first and second memory cell arrays; and a plurality of data holding means provided corresponding to said plurality of data lines, each having input/output portion connected to a corresponding data line, for temporarily holding data, the method comprising the steps of:

selecting any one of said plural word lines;

connecting only bit line pairs corresponding to the word line to be selected by said selecting step, to the corresponding sense amplifier means, respectively, and connecting only bit line pairs corresponding to the word line to be selected by said selecting step, to the corresponding data holding means, respectively, wherein bidirectional transfer of data is carried out between said first and second memory cell array via said plurality of data holding means.

13. A semiconductor memory device comprising first and second memory cell arrays each including a plurality of memory cells arranged in plural rows and plural columns, a plurality of bit line pairs disposed in said plural columns and connected to a plurality of memory cells in corresponding columns, said plural bit line pairs comprising a plurality of groups or sets each group or set including a plurality of bit line pairs which are simultaneously operated in one operating timing, a plurality of word lines connected to a plurality of memory cells in corresponding rows, a plurality of sense amplifiers each disposed for a predetermined number of bit line pairs, each one from each group or set of said plurality of groups or sets, disclosed in a predetermined number of adjacent columns in said plural columns, and each sensing and amplifying potential difference between a bit line pair connected thereto, a plurality of switching means provided corresponding to said plurality of sense amplifier, respectively, and each selectively connecting to a corresponding sense amplifier one of said plurality of bit line pairs corresponding to that sense amplifier; and a plurality of data holding means disposed corresponding to said plurality of sense amplifiers in said first and second memory cell arrays for temporarily holding data, each data holding means disposed for said predetermined number of adjacent columns, each memory cell array further including a plurality of transfer means provided corresponding to said plurality of data holding means, respectively, and each transfer means selectively connecting to the corresponding data holding means one of said plurality of bit line pairs corresponding to that holding means wherein bidirectional transfer of data is carried out between said first and second memory cell array via said plurality of data holding means.

14. A semiconductor memory device as recited in claim 13, wherein each of said plurality of data holding means has an input/output portion for receiving/providing data, and each transfer means is provided corresponding to the corresponding plurality of bit line pairs and comprises a plurality of switching devices each having one terminal connected to the input/output portion of the corresponding holding means and the other terminal connected to one bit line of the corresponding bit line pair in the corresponding plurality of bit line pairs.

15. A semiconductor memory device, comprising first and second memory cell arrays each including
 a plurality of memory cells arranged in plural rows and plural columns,
 a plurality of bit line pairs disposed in said plural columns and connected to a plurality of memory cells in corresponding columns,
 a plurality of word lines connected to a plurality of memory cells in corresponding rows,
 a plurality of sense amplifiers each disposed for a predetermined number of adjacent columns in said plural columns, and each sensing and amplifying potential difference between a bit line pair connected thereto,
 a plurality of switching means provided corresponding to said plurality of sense amplifier, respectively, and each selectively connecting to a corresponding sense amplifier one of said plurality of bit line pairs corresponding to that sense amplifier; and a plurality of data holding means disposed corresponding to said plurality of sense amplifiers in said first and second memory cell arrays for temporarily holding data, each data holding means disposed for said predetermined number of adjacent columns, each memory cell array further including a plurality of transfer means provided corresponding to said plurality of data holding means, respectively, and each transfer means selectively connecting to the corresponding data holding means one of said plurality of bit line pairs corresponding to that holding means, wherein each of said plural of data holding means has an input/output portion for receiving/providing data, each transfer means is provided corresponding to the corresponding plurality of bit line pairs and comprises a plurality of switching devices each having one terminal connected to the input/output portion of the corresponding holding means and the other terminal connected to one bit line of the corresponding bit line pair in the corresponding plurality of bit line pairs, each data holding means includes
 a first inverter having an input node connected to the input/output of the data holding means, and an output node,
 a second inverter having an input node and an output node connected to the output node of the first inverter,
 a first switching device connected between the output node of the second inverter and said input/output portion,
 a second switching device controlled by a serial data selector and connected between the input node of said first inverter and one serial input/output line of a serial input/output line pairs in the serial data selector, and
 a third switching device controlled by the serial data selector and connected between the output node of said first inverter and other serial input/output line of the serial input/output line pairs in the serial data selector, and bidirectional transfer of data is carried out between said first and second memory cell array via said plurality of data holding means.

16. A semiconductor memory device comprising:

a first memory cell array including a plural of memory cells arranged in plural rows and plural columns, a plurality of bit line pairs disposed in said plural columns and connected to a plurality of memory cells in corresponding columns, said plural bit line pairs comprising a plurality of groups or sets each group or set including a plurality of bit line pairs which are simultaneously operated in one operating timing, and a plurality of word lines connected to a plurality of memory cells in corresponding rows, a second memory cell array including a plurality of memory cells arranged in plural rows and plural columns, said plural bit line pairs comprising a plurality of groups or sets each group or set including a plurality of bit line pairs which are simultaneously operated in one operating timing, a plurality of bit line pairs disposed in said plural columns and connected to a plurality of memory cells in corresponding columns, and a plurality of word lines connected to a plurality of memory cells in corresponding rows, a plurality of data lines each disposed for a predetermined number of adjacent columns in said plural columns in said first and second memory cell arrays, a plurality of data holding means provided corresponding to said plurality of data lines for temporarily holding data, each data holding means having an input/output portion connected to a corresponding data line, a plurality of first transfer means provided corresponding to said plurality of data lines, respectively, and each selectively connecting to the corresponding data line one of a plurality of bit line pairs corresponding to that data line in said first memory cell array, and a plurality of second transfer means provided corresponding to said plurality of data lines, respectively, and each selectively connecting to the corresponding data line one of a plurality of bit line pairs corresponding to that data line in said second memory cell array.

17. A semiconductor memory device, comprising:

a first memory cell array including a plural of memory cells arranged in plural rows and plural columns, a plurality of bit line pairs disposed in said plural columns and connected to a plurality of memory cells in corresponding columns, and a plurality of word lines connected to a plurality of memory cells in corresponding rows, a second memory cell array including a plurality of memory cells arranged in plural rows and plural columns, a plurality of bit line pairs disposed in said plural columns and connected to a plurality of memory cells in corresponding columns, and a plurality of word lines connected to a plurality of memory cells in corresponding rows, a plurality of data lines each disposed for a predetermined number of adjacent columns in said plural columns in said first and second memory cell arrays, a plurality of data holding means provided corresponding to said plurality of data lines for temporarily holding data, each data holding means having an input/output portion connected to a corresponding data line, a plurality of first transfer means provided corresponding to said plurality of data lines, respectively, and each selectively connecting to the corresponding data line one of a plurality of bit line pairs corresponding to that data line in said first memory cell array, and a plurality of second transfer means provided corresponding to said plurality of data lines, respectively, and each selectively connecting to the corresponding data line one of a plurality of bit line pairs corresponding to that data line in said second memory cell array, wherein each of said plurality of data holding means has an input/output portion for receiving/providing data, each transfer means is provided corresponding to the corresponding plurality of bit line pairs and comprises a plurality of switching devices each having one terminal connected to the input/output portion of the corresponding holding means and other terminal connected to one bit line of the corresponding bit line pair in the corresponding plurality of bit line pairs, and each said data holding means includes
a first inverter having an input node connected to the input/output of the data holding means, and an output node,
a second inverter having an input node and an output node connected to the output node of the first inverter,
a first switching device connected between the output node of the second inverter and said input/output portion, a second switching device controlled by a serial data selector and connected between the input node of said first inverter and one serial input/output line of a serial input/output line pairs in the serial data selector, and a third switching device controlled by the serial data selector and connected between the output node of said first inverter and other serial input/output line of the serial input/output line pairs in the serial data selector.

18. A semiconductor memory device comprising:

a memory cell array including a plurality of memory cells and a plurality of bit line pairs, a plurality of data holding means provided corresponding to said plurality of bit line pairs, each data holding means temporarily holding data, a plurality of transfer means provided corresponding to said plurality of data holding means, each disposed between the corresponding data holding means and the corresponding bit line pairs, each of said data holding means having an input/output portion, a first inverter having an input node connected to the input/output portion and an output node, a second inverter having an input node connected to the output node of said first inverter and an output node, a first switching device connected between the output node of the second inverter and said input/output portion, a second switching device controlled by a serial data selector and connected between the input node of said first inverter and one serial input/output line of a serial input/output line pair, a third switching device controlled by said serial data selector and connected between the output node of said first inverter and the other serial input/output line of said serial input/output line pair, each of said transfer means comprising a switching device having one terminal connected to the input/output portion of the corresponding data holding means and other terminal connected to one bit line of the corresponding bit line pair.

19. A semiconductor memory device comprising:

first and second memory cell arrays each including a plurality of memory cells and a plurality of bit line pairs, a common data holding means shared by said first and second memory cell arrays, first transfer means provided between said first memory cell array and said common data holding means, and a second transfer means provided between said second memory cell array and said common data holding means, said common data holding means including a plurality of data holding portions, each data holding portion having an input/output portion, a first inverter having an input node connected to the input/output portion and an output node, a second inverter having an input node connected to the output node of said first inverter, and an output node, a first switching device connected between the output node of the second inverter and said input/output portion, a second switching device controlled by a serial data selector and connected between the input node of said first inverter and one serial input/output line of a serial input/output line pair, and a third switching device controlled by said serial data selector and connected between the output node of said first inverter and the other serial input/output line is said serial input/output line pair, said first transfer means comprising a first plurality of switching devices each having one terminal connected to the input/output portion of the corresponding data holding portion in said common data holding means and one bit line of the corresponding bit line pair in said first memory cell array, said second transfer means comprising a second plurality of switching-devices each having one terminal connected to the input/output portion of the corresponding data holding means in said common data holding means and other terminal connected to one bit line of the corresponding bit line pair in said second memory cell array.

\* \* \* \* \*